US009756228B2

(12) United States Patent
Barrows

(10) Patent No.: US 9,756,228 B2
(45) Date of Patent: Sep. 5, 2017

(54) LOW PROFILE CAMERA AND VISION SENSOR

(71) Applicant: Geoffrey Louis Barrows, Washington, DC (US)

(72) Inventor: Geoffrey Louis Barrows, Washington, DC (US)

(*) Notice: Subject to any disclaimer, the term of this patent is extended or adjusted under 35 U.S.C. 154(b) by 0 days.

(21) Appl. No.: 14/811,606

(22) Filed: Jul. 28, 2015

(65) Prior Publication Data

US 2015/0334279 A1  Nov. 19, 2015

Related U.S. Application Data

(63) Continuation of application No. 12/710,073, filed on Feb. 22, 2010, now abandoned.

(Continued)

(51) Int. Cl.
*H01L 21/00* (2006.01)
*H04N 5/225* (2006.01)
(Continued)

(52) U.S. Cl.
CPC ........... *H04N 5/2253* (2013.01); *B32B 3/266* (2013.01); *B32B 37/12* (2013.01); *B32B 37/18* (2013.01); *H01L 27/14625* (2013.01); *H01L 27/14685* (2013.01); *H01L 31/0203* (2013.01); *H01L 31/1876* (2013.01); *H04N 5/2254* (2013.01); *B32B 2037/1253* (2013.01); *B32B 2250/02* (2013.01); *B32B 2255/00* (2013.01); *B32B 2307/41* (2013.01); *B32B 2307/412* (2013.01); *B32B 2310/0831* (2013.01); *B32B 2551/00* (2013.01); *B32B 2559/00* (2013.01); *H01L 2224/32145* (2013.01); *H01L 2224/48091* (2013.01); *H01L 2224/48227* (2013.01); *H01L 2224/48472* (2013.01); *H01L 2224/8592* (2013.01); *Y10T 29/49828* (2015.01); *Y10T 29/49886* (2015.01); *Y10T 156/10* (2015.01)

(58) Field of Classification Search
CPC ......... H01L 27/14625; H01L 27/14685; H01L 31/0203
See application file for complete search history.

(56) References Cited

U.S. PATENT DOCUMENTS 4,231,659 A * 11/1980 Logan .................... G03B 41/00
355/132
5,969,343 A * 10/1999 Nakamura ......... H04N 1/02815
250/227.26

(Continued)

*Primary Examiner* — Richard Booth
(74) *Attorney, Agent, or Firm* — White & Case LLP

(57) ABSTRACT

A camera configured for a predetermined environment can be made low profile in the following manner. The camera includes an image sensor that has a light sensitive portion that can sense light from the predetermined environment. A substantially opaque mask is disposed above the light sensitive portion of the image sensor and has at least one opening through which the image sensor senses light. The low profile structure of the camera can be realized with substantially transparent material disposed between the substantially opaque mask and the image sensor that has index of refraction that is greater than an index of refraction of the predetermined environment. Accordingly, light through the opening refracts as it passes through the substantially transparent material to the image sensor.

32 Claims, 37 Drawing Sheets

Related U.S. Application Data

(60) Provisional application No. 61/229,312, filed on Jul. 29, 2009.

(51) Int. Cl.
    *B32B 3/26*           (2006.01)
    *B32B 37/12*         (2006.01)
    *B32B 37/18*         (2006.01)
    *H01L 31/18*         (2006.01)
    *H01L 31/0203*     (2014.01)
    *H01L 27/146*      (2006.01)

(56) References Cited

U.S. PATENT DOCUMENTS

| | | | | |
|---|---|---|---|---|
| 6,137,535 A | * | 10/2000 | Meyers | G02B 3/0043 |
| | | | | 250/208.1 |
| 2010/0177235 A1 | * | 7/2010 | Duparre | H01L 27/14627 |
| | | | | 348/345 |

* cited by examiner

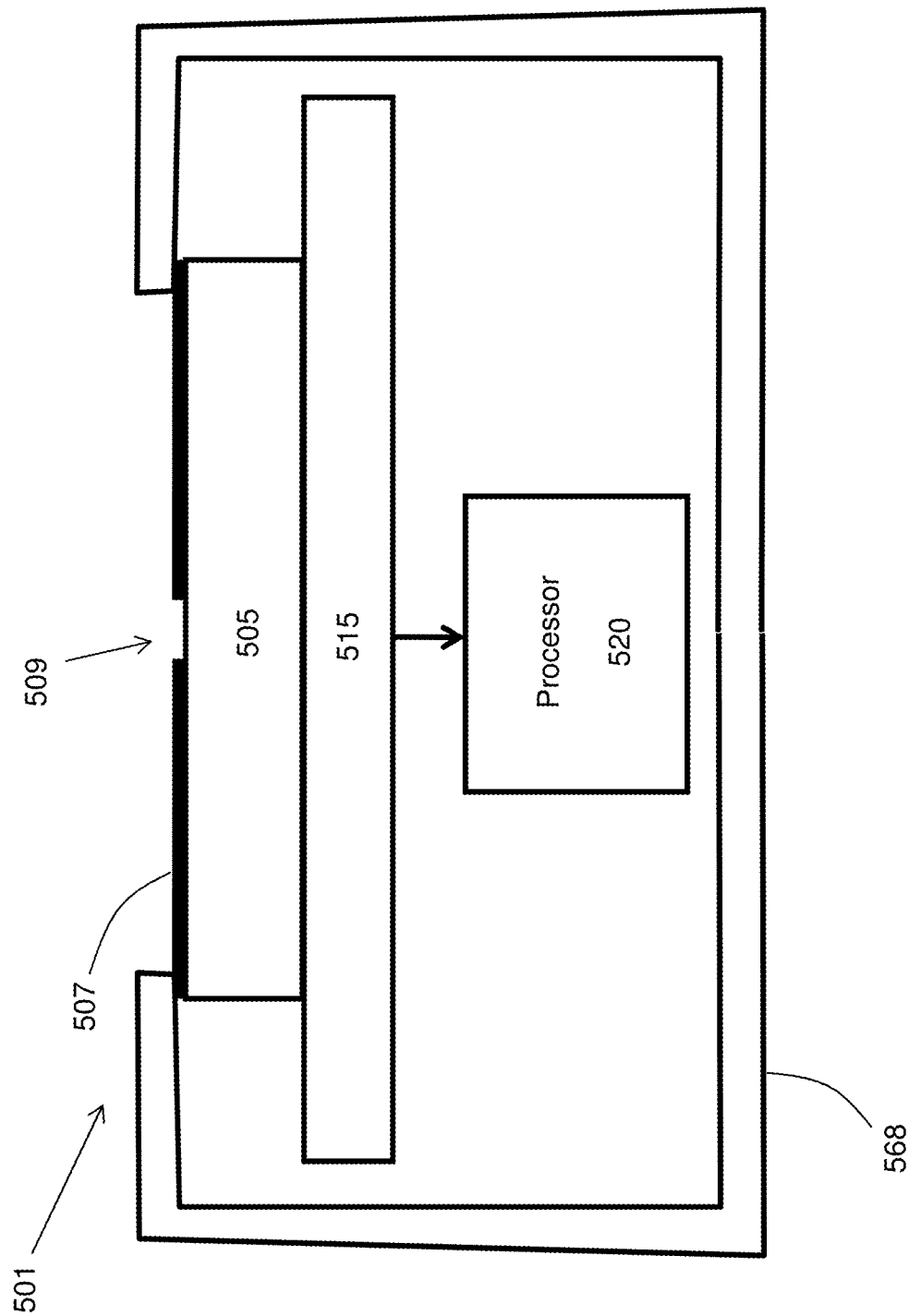

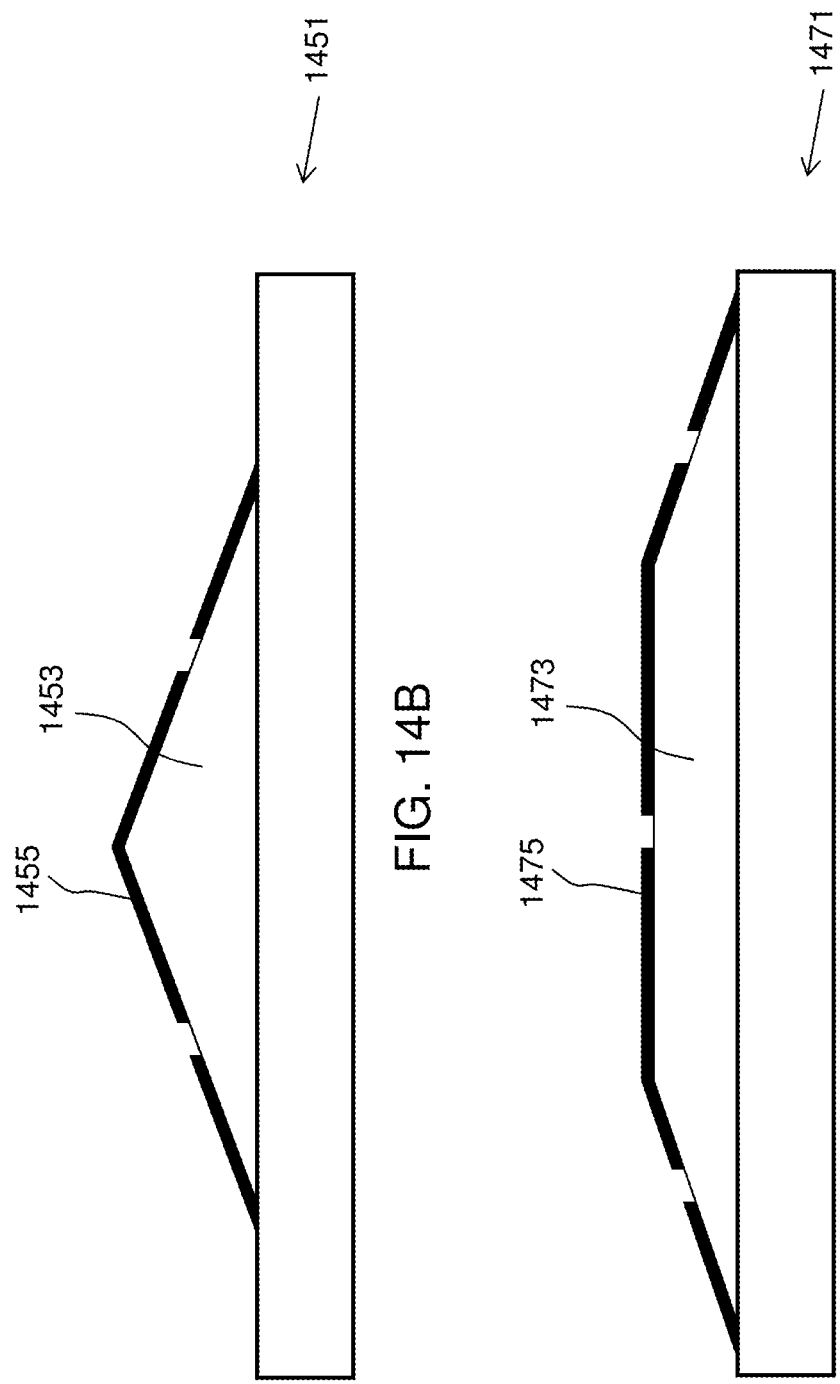

LOW PROFILE CAMERA AND VISION SENSOR

CROSS-REFERENCE TO RELATED APPLICATIONS

This application claims the benefit of U.S. patent application Ser. No. 12/710,073, filed 2010 Feb. 22, which claims the benefit of provisional patent application Ser. No. 61/229,312, filed 2009 Jul. 29, each of which is incorporated herein by reference.

FEDERALLY SPONSORED RESEARCH

This invention was made with Government support under Contract No. W31P4Q-06-C-0290 awarded by the United States Army. The Government has certain rights in this invention.

TECHNICAL FIELD

The teachings presented herein relate to electronic cameras and electronic visual sensors.

BACKGROUND

Throughout most of the 20th century, cameras captured images on film by a photochemical process to produce pictures that represent the original scene observed by the camera. Towards the latter part of the 20th Century, solid state image sensors in the form of CCDs (charge coupled devices) and CMOS (complementary metal-oxide-semiconductor) image sensors took the place of film to enable today the ubiquitous digital camera. Digital cameras do not require film to capture images, and have the advantage of capturing images electronically that take the form of digital data which may be stored easily for later editing, processing, and printing. In some applications, the digital imagery may be sent to a computer for real-time processing in order to generate an output. These latter configurations may also be referred to as cameras as well as machine vision systems or vision sensors.

FIG. 1 depicts an exemplary generic digital camera 101. A lens 103 focuses light 105 from the environment 116 surrounding the camera 101 onto the focal plane 107 of an image sensor 109. The lens 103 is shown in the figure as a single element lens, but alternatively it may be a pinhole or it may comprise a set of lens elements and/or reflective elements, e.g. mirrors. In all such design configurations, the lens 103 (or other optics) is positioned a distance above the focal plane 107, forming cavity 117, so that light 105 is focused to form an image onto the focal plane 107. The lens 103 may be fixed to one location and a predetermined distance above the focal plane 107, or the lens 103 may be configured so that it may be moved closer or further from the focal plane 107 to bring the image into focus. An opaque enclosure 111 supports the lens 103 and ensures that the only light striking the image sensor 109 is light coming through the lens 103. The image sensor 109 may be electronically interfaced with the rest of the camera electronics via wire bonds 113 or another connection method. A processor 115, typically a microcontroller, a DSP (digital signal processor) chip, or other digital circuit extracts a digital image from the image sensor 109 based on the image formed on the focal plane 107. The digital image may be processed, stored, and/or transmitted on as an output, depending on the configuration of the camera 101 and its application.

In earlier cameras the image sensor 109 would be replaced by film, which as described above captures images photochemically. The photochemical process of "developing the film" may thus conceptually replace the function performed by the image sensor 109 and the processor 115.

While the exemplary generic digital camera 101 shown in FIG. 1 has the advantage of relative simplicity and maturity, it has several significant disadvantages. First, the enclosure 111 and mechanism for mounting the lens 103 needs to be rigid and constructed to hold the lens 103 at the desired location as well as form cavity 117. This potentially results in a bulky and heavy structure. Second, there are significant trade-offs between camera specifications such as F-stop, focal length, and field of view. These trade-offs are such that constructing a camera to have both a small F-stop (to gather large amounts of light) and a large resolution requires a lens design having multiple large lens elements disposed in a vertically stacked configuration and a heavy structure to support them, making the camera bulky and expensive to manufacture. Additional requirements that the camera have a field of view approaching 180 degrees further increases the complexity of the lens design.

FIG. 2 depicts a prior art camera 201 optimized for sensing visual motion or optical flow in one direction. This camera 201 is described at length in U.S. Pat. No. 6,194,695 incorporated herein by reference in its entirety. This camera 201 comprises an iris 203, an optional lens 205, cavity 219, a focal plane chip 207, an analog to digital converter (ADC) 209, and a digital computer 211 which generates an output 217. The iris 203 and lens 205 focus light onto the focal plane 207 in a manner that preserves visual information along one axis. The lens 205, at a predetermined distance from the focal plane 207 forming cavity 219, may be placed "out of focus" with respect to the focal plane chip 207 to optically smooth the image formed on the focal plane chip 207. The focal plane chip 207 generates photoreceptor signals 213, and the digital computer 211 contains an algorithm 215 that acquires these photoreceptor signals 213 and processes them to compute a linear optical flow measurement. This measurement forms the output 217.

The camera 201 of FIG. 2 may be simplified by removing the lens 205. In this manner, the iris 203 is effectively an elongated pinhole, which causes individual photoreceptor circuits on the focal plane chip 207 to have a rectangular response to the visual field. This causes the image focused on the focal plane chip 207 to be smoothed along the long dimension of the iris 203, which preserves information in the perpendicular direction. The photoreceptor circuits may also be shaped as elongated rectangles oriented in the same direction as the iris to increase light sensitivity, as shown in FIGS. 4A and 4B of the aforementioned U.S. Pat. No. 6,194,695.

The computer 211 generates an optical flow measurement based on the photoreceptor signals 213 and sends the optical flow measurement to the output 217. Optical flow represents the relative motion between a camera and other objects in the environment. Algorithms for measuring optical flow between two successive images are well known in the art. The output of such algorithms may be a measurement of, for example, how many pixels or fractions of a pixel the texture appeared to move between two sequential images. Sample optical flow algorithms include Srinivasan's Image Interpolation Algorithm and the Lucas Kanade algorithm, both of which are referenced below.

The camera of FIG. 2 has the same disadvantages as does the camera of FIG. 1 described above.

It is desirable to implement cameras and vision sensors that overcome some of the aforementioned disadvantages and limitations. In particular, it is desirable to have a camera structure that is able to acquire a high resolution image over a large field of view but have a shape that has a low profile and is effectively flat. FIG. 3 depicts a prior art "TOMBO" camera 301 described in U.S. Pat. No. 7,009,652 which is incorporated herein by reference in its entirety. The acronym TOMBO stands for "Thin Observation Module by Bound Optics". The camera 301 comprises a lens array 303, a restricting structure 311, and an image sensor 305. The image sensor 305 contains a pixel array 313 located at the focal plane of the lenses of lens array 303. Instead of using a single lens as shown in FIG. 1, the camera 301 of FIG. 3 utilizes lens array 303 to form an array of images on the pixel array 313. A single aperture unit 307 comprises a single lens and its corresponding set of pixels (which may be referred to as its subimage 309) on the image sensor 305, and is similar to the camera 101 of FIG. 1. Restricting structure 311 isolates adjacent aperture units and prevents light from crossing over between adjacent single aperture units. The restricting structure 311 has a predetermined thickness and forms a cavity between each individual lens element and corresponding portion of the pixel array 313 that captures a subimage. The image sensor 305 grabs the resulting subimages, which will appear as a tiling of low resolution images generated from the visual field. This tiling of images obtained by the image sensor 305 may be referred to as a "raw image" for purposes of discussion.

A processor, not shown, contains an algorithm that extracts the subimages from the pixel array 313 and reconstructs a high resolution image of the visual field. The algorithm exploits the fact that the individual subimages generated by each aperture unit are similar but not exactly the same, since each lens may be laterally offset from the pixel array 313 on the focal plane by a different sub-pixel amount. The algorithm proposed by Tanida et al. models the camera 301 as $$y = Hx \quad (1)$$

where x is a vector that represents the visual field, y is a vector that represents the raw image captured by the pixel array, and H is a matrix that models the transfer function implemented by the camera 301. The vector x may be an ideal high resolution image that would be captured by the conventional camera structure shown in FIG. 1. The purpose of the algorithm is thus to reconstruct x from raw image y. H may be determined through a combination of analytical and empirical analysis, obtaining a pseudoinverse matrix $H^*$ of the transfer function H, and computing $$x = H^* y \quad (2)$$

to reconstruct the high resolution image x representing the visual field from y.

The camera 301 shown in FIG. 3 has the advantage of being able to acquire higher resolution images from a thinner optical structure relative to that described above for FIGS. 1 and 2. For example, the light gathering ability of a single low F-stop lens is obtained instead through the distributed light gathering ability of the lens array 303. However in spite of a perceived elegance of this apparatus, it suffers from two particular disadvantages. First, the lens array 303 and restricting structure 311 are complex and may be difficult to manufacture inexpensively. It also suffers from a bulky structure. Second, the proposed method of reconstructing the high resolution image x from y requires both an accurate knowledge of the transfer function H and a significant number of computations to compute Equation (2). These weaknesses may limit the utility of the camera 301 in many practical applications.

FIG. 4 illustrates Snell's Law, a fundamental law of optics that dictates how a ray of light 401 will travel when it passes between two different transparent mediums. In FIG. 4, the ray of light 401 originates in a first medium 403, passes through a second medium 405, and exits back into the first medium 403 on the other side. Let the index of refraction of the first medium 403 be $n_1$ and the index of refraction of the second medium 405 be $n_2$. Let $\theta_1$ and $\theta_2$ be the respective angles of incidence of the ray 401 as it passes across the boundary 407 between the two mediums, as shown in the figure. The angle of incidence of a ray is defined as the angle between that ray and normal 408, with normal 408 being perpendicular to the boundary 407 between the two mediums. Snell's Law dictates that:

$$n_1 \sin \theta_1 = n_2 \sin \theta_2 \quad (3)$$

or $$\sin \theta_2 = \frac{n_1}{n_2} \sin \theta_1. \quad (4)$$

In the case of FIG. 4, the index of refraction of the second medium 405 is higher than that of the surrounding first medium 403. For example, the first medium 403 may be air while the second medium 405 may be plastic or glass. As a result, the angle $\theta_2$ will be less than $\theta_1$. One important observation is that if the second medium 405 has a higher index of refraction than the first medium 403, the value $|\sin \theta_2|$ is bounded by the value $n_1/n_2$, since $\sin \theta_1$ cannot exceed one in magnitude. As a result, $\theta_2$ cannot be larger than an angle called a critical angle, which is denoted by $\theta_c$:

$$|\theta_2| < \theta_c = \sin^{-1} \frac{n_1}{n_2} \quad (5)$$

The phenomena of the critical angle will have application in the teachings that follow. From the point of view of an observer inside the second medium, the hemisphere of visual field on the first medium's side of the boundary 407 will be compressed to a cone having an angular diameter of $2\theta_c$. This cone is often referred to as "Snell's window". This phenomena can be observed, for example, from underwater in a swimming pool by looking outward at the world above.

BRIEF DESCRIPTION OF THE DRAWINGS

The inventions claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 5F shows an opaque enclosure surrounding the single aperture low profile camera of FIG. 5A;

FIG. 14B illustrates a camera where the transparent material and opaque mask have a cross section in the shape of a triangle;

FIG. 14C illustrates a camera where the transparent material and opaque mask have a cross section in the shape of a trapezoid;

DESCRIPTIONS OF EXEMPLARY EMBODIMENTS

Figure 1:
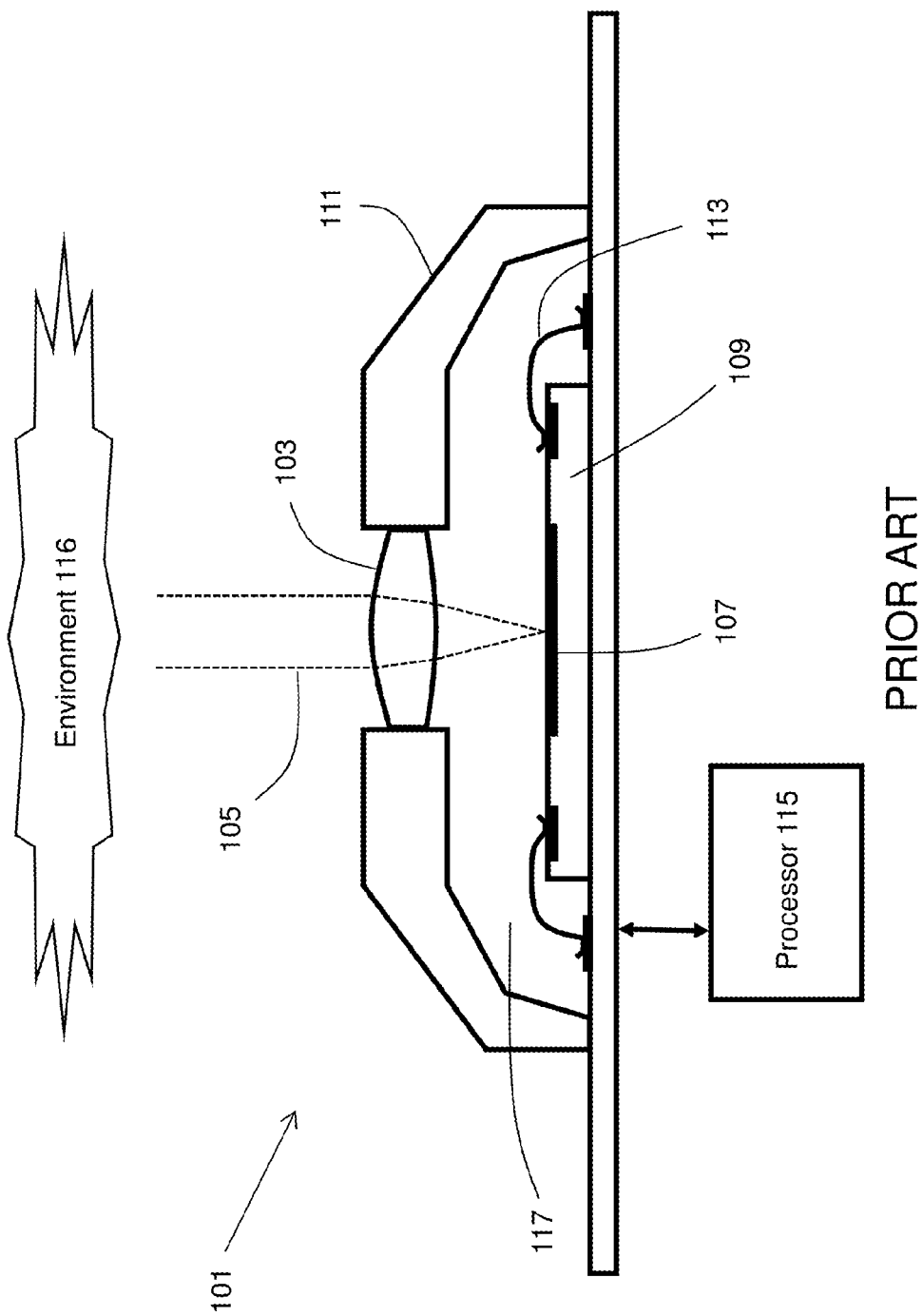
FIG. 1 depicts an exemplary generic digital camera.
Figure 2:
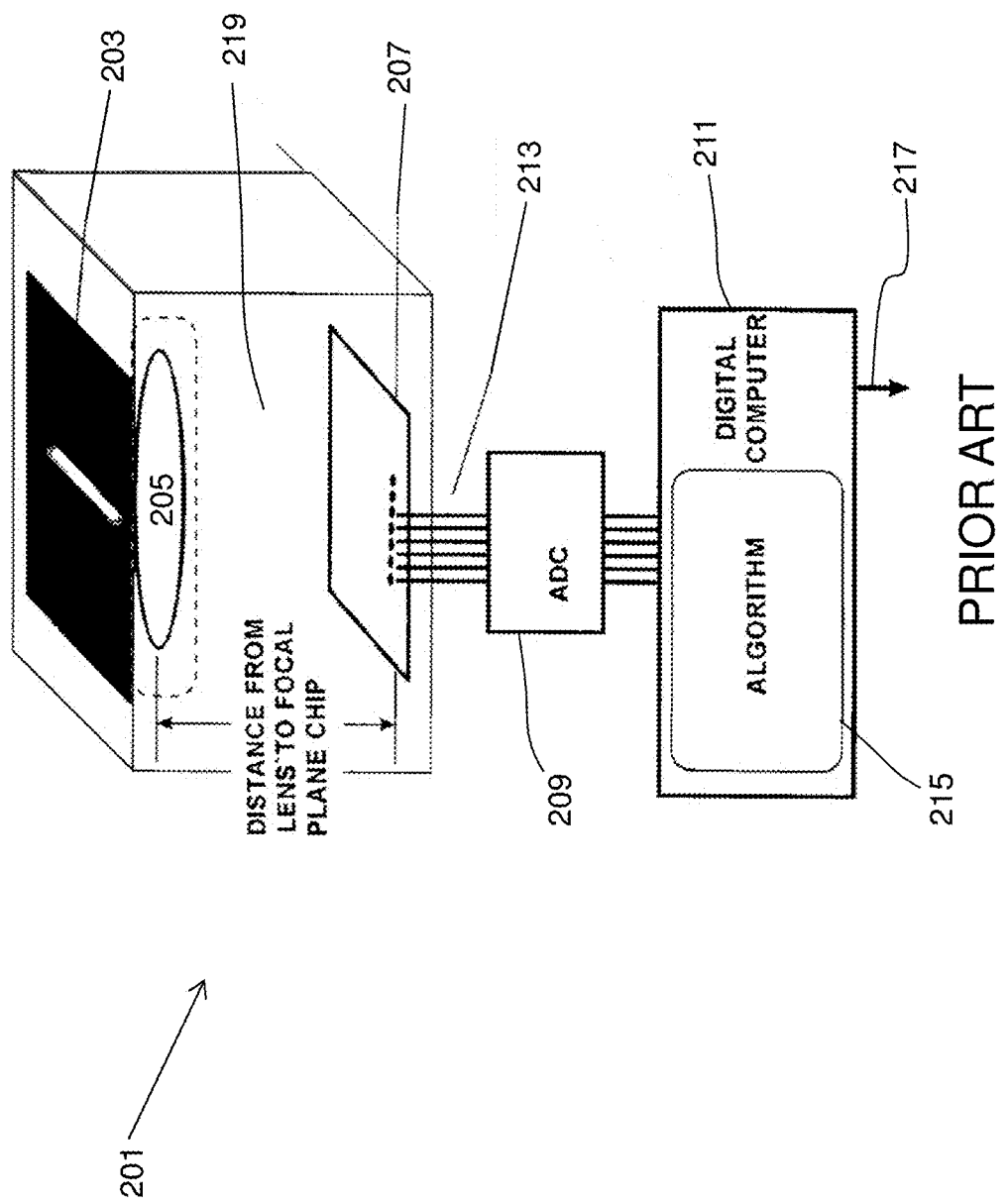
FIG. 2 depicts a prior art camera optimized for sensing visual motion or optical flow in one direction.

The exemplary embodiments will now be described more fully hereinafter with reference to the accompanying drawings. It will be understood that when a layer is referred to as being "on" another layer or substrate, it may be directly on the other layer or substrate, or intervening layers may also be present. Further, it will be understood that when a layer is referred to as being "under" another layer, it may be directly under, or one or more intervening layers may also be present. In addition, it will also be understood that when a layer is referred to as being "between" two layers, it may be the only layer between the two layers, or one or more intervening layers may also be present. Like numbers refer to like elements throughout.

Image sensors may be implemented as semiconductor devices, for example using CCD or CMOS technology, or by other means of generating a plurality of pixel values based on a spatial pattern of light. In the following teachings, an "image sensor" may be any device or circuit from which one or more pixel values based on a pattern of light may be generated, and includes devices that respond to visible light as well as devices that respond to electromagnetic radiation other than visible light for example ultraviolet, infrared, and other electromagnetic radiation. An image sensor may be implemented using semiconductor or any other technology. An image sensor may be a separate discrete component or collection of circuits, or it may be a circuit or device embedded or integrated within a component. Similarly, "light" may refer to any electromagnetic radiation, including but not limited to visible, infrared, or ultraviolet light.

"Cameras", and the equivalent term "vision sensors", are devices that utilize image sensors and acquire information about a scene observable from the device. Generally a camera may comprise an optical structure and an image sensor, in which the optical structure is capable of forming an image on the image sensor based on the environment and the image sensor is capable of generating a plurality of signals based on the image. These signals may be "pixel values" or other signals. The term "camera" is not meant to be limited to the typical consumer or industrial picture-taking device that is typically associated with this word. For the purpose of the teachings below, a camera optionally may also include a processing circuit capable of processing the image sensor's output for any purpose. The output of a camera may be a collection of pixel values (e.g. a "picture"), or may be higher level information regarding the scene observed by the camera. Examples of such higher level information include, but are not limited to, one or more optical flow values, one or more computed range values, the presence or absence of a particular type of object as seen from the camera, and so forth. The term "camera" is not meant to be limited to the examples above but instead covers any type of device capable of sensing a scene utilizing an image sensor and optics. This includes cameras capable of observing both visual light as well as cameras capable of observing other electromagnetic radiation, including but not limited to ultraviolet and infrared radiation.

Figure 5A:
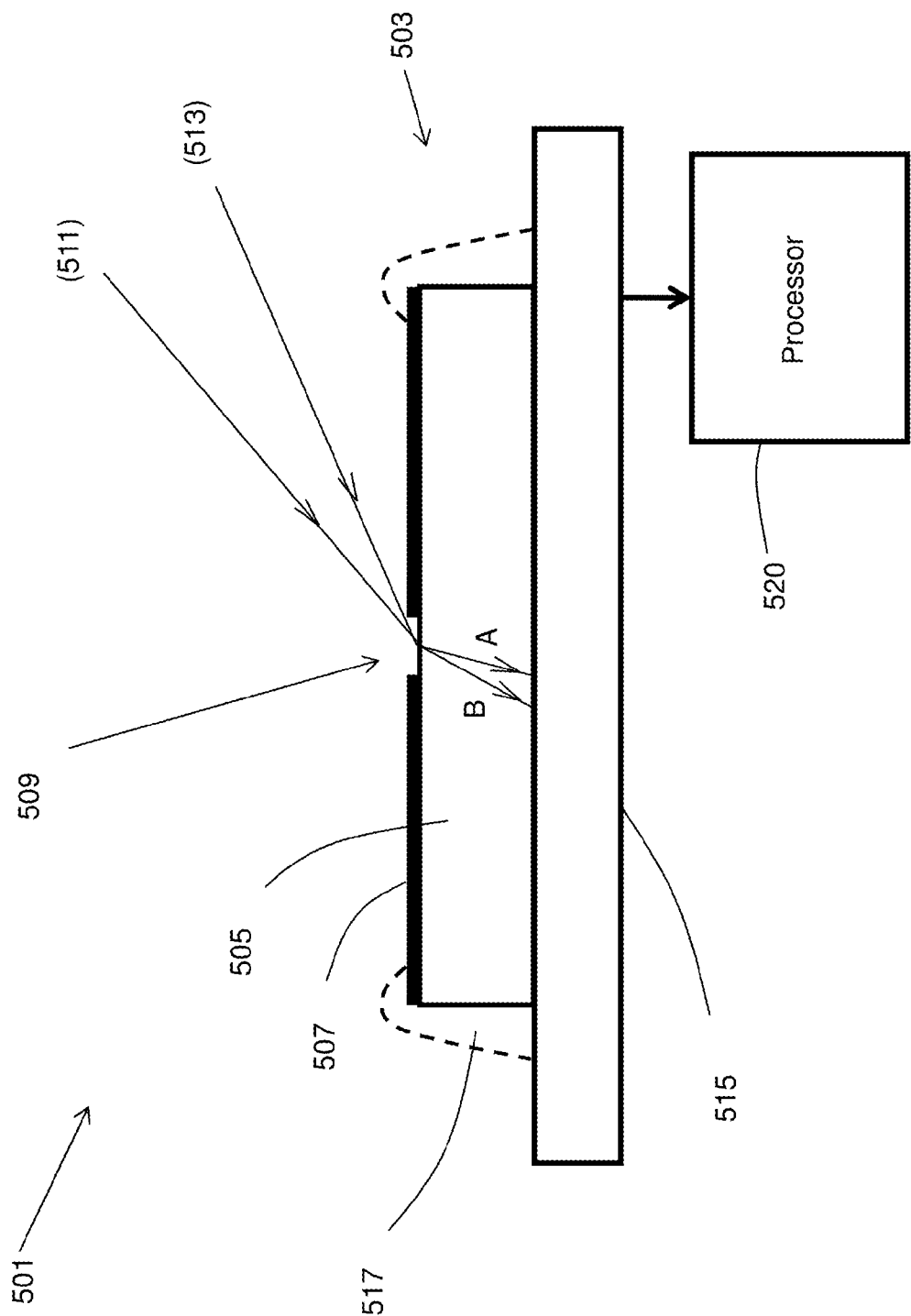
FIG. 5A depicts the cross section of an exemplary single aperture low profile camera.
Figure 5B:
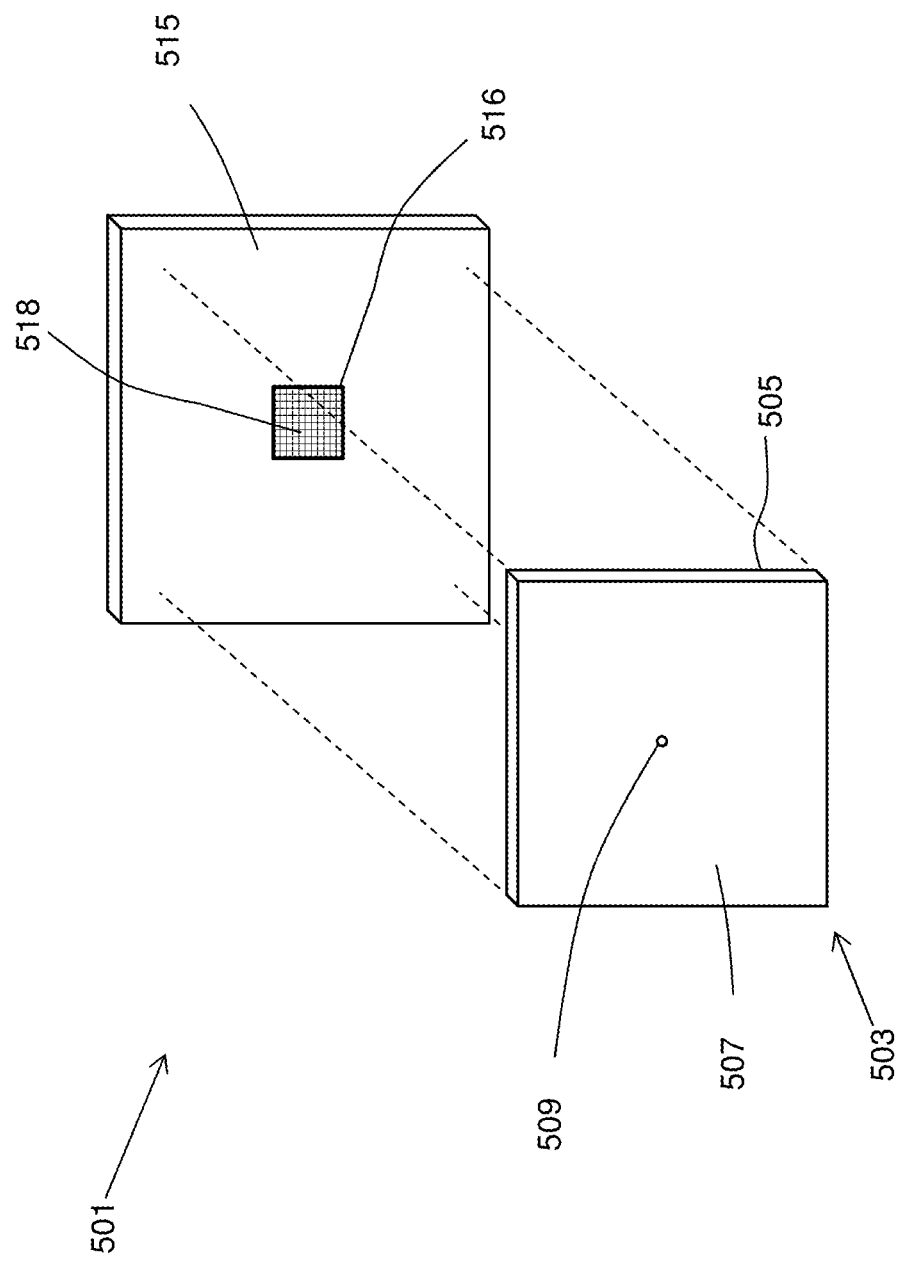
FIG. 5B shows an exploded view of the exemplary single aperture low profile camera of FIG. 5A.

FIG. 5A depicts a cross section of an exemplary single aperture low profile camera 501, and FIG. 5B shows an exploded view of the same. The exemplary single aperture low profile camera 501 comprises an optical structure 503 disposed on an image sensor 515 having a pixel array 516 of pixel elements 518 that are sensitive to light, i.e., the pixel array senses light. Processor 520 may be connected to the image sensor 515 in order to readout and process an image captured by it. The combination of the optical structure 503, image sensor 515 and processor 520 therefore forms a camera.

In the exemplary embodiment, the optical structure 503 comprises an opaque mask 507 disposed on one side of a piece of transparent material 505. The other side of the transparent material 505 is placed directly onto image sensor 515. The transparent material 505 has an index of refraction higher than that of the surrounding environment for the intended use of the image sensor 501. If the surrounding environment is free space (vacuum) or air, both of which have an index of refraction of about 1.0, then materials such as plastic or glass may be used. Glass typically has an index of refraction between about 1.5 and 1.9, depending on the specific type of glass, while many plastics have indices of refraction between about 1.4 and 1.6. Such glasses and plastics may therefore be used as transparent material 505 in an air or free space environment. If the surrounding environment is water, which has an index of refraction of about 1.33, then materials having an index of refraction higher than that of water may be used, for example flint glass (index of refraction 1.6) or sapphire (index of refraction 1.8). There are numerous other types of surrounding environments for which the camera 501 may be configured, and it is well within one of ordinary skill in the art to choose transparent material having a certain index of refraction for a given surrounding environment.

The opaque mask 507 is opaque everywhere except for a single opening 509 through which light may pass. The optical structure 503 is mounted on the image sensor 515 so that the opening 509 is over the pixel array 516 so that light entering the opening 509 strikes the pixel array 516. The opaque mask 507 need not be perfectly opaque, but opaque enough that the image formed through the opening 509 is distinguishable from any leaking or parasitic light. This may require an opaqueness of 99%, 99.9%, or more depending on the specific application. In general, for a given thickness of the transparent material 505, decreasing the size of the opening will require a higher opaqueness in the surrounding mask. In this manner, light from the environment will pass through the opening 509, bend due to refraction as it crosses into the transparent material 505, and strike pixel array 516 on the image sensor 515. Rays A (511) and B (513) show two possible paths of light through the opening 509. In this manner, the opening 509 acts as a pinhole and causes an image of the visual field to be formed on the pixel array 516. Note that the size of the opening 509 is exaggerated in FIG. 5A for clarity and may be substantially smaller than that suggested in the figure. Processor 520 operates the pixel array 516 and associated circuitry (not shown) on the image sensor 515 and acquires the resulting image striking the pixel array 516.

It is generally beneficial to add additional opaque material 517 at the side edges of transparent material 505 in order to prevent light from entering the transparent material 505 from the side and ultimately striking the light sensing region of the image sensor 515. The opaque material 517 may double as an adhesive that attaches the optical structure 503 to the image sensor 515, and may be made with "glop" or with a substantially opaque epoxy such as JB Weld®. In specific applications where the camera 501 is mounted inside of an opaque housing that would prevent light from entering the sides of transparent material 505, opaque material 517 is not needed. Alternatively, one may place opaque structures within the transparent material 505 so that any light entering the transparent material 505 will not reach the light sensing region of the image sensor 515.

The optical structure 503 may be fabricated as follows: First, a plastic or glass plate or sheet may be used to form a base structure and corresponds to the transparent material 505. Next, the opaque mask 507 is formed by depositing, printing, or photocuring opaque material everywhere on the plastic or glass sheet except for where the opening 509 is to be formed. The opaque mask 503 may be formed by a printer or photoplotter of the type used to fabricate photomasks that may be used to fabricate printed circuit boards as well as to form optical encoders. Photoplotters are capable of producing opaque masks that are 99% or even 99.9% or more opaque and would be suitable for use in the exemplary embodiment. For example, the laser plotters manufactured (as of year 2009) by Ucamco of Gent, Belgium may be used.

The opaque mask 507 may be printed onto transparent sheets of plastic, for example Kodak Accumax ARD7 sheets, which are available in thicknesses such as 0.007 inches (7 mils). The opaque mask may be made from a material such as silver halide photographic emulsion that is cured by light to form the desired mask pattern. This method allows a large number of opaque masks to be inexpensively fabricated in bulk, by printing an array of opaque mask patterns on a single sheet of transparent material, and then cutting the sheet into individual optical structures.

The opening 509 may be approximately the same shape as the corresponding one or more pixel elements 518 in the pixel array 516 that senses the light through the opening 509. Moreover, the size of the opening 509 may be chosen based on the needs of a particular application. Making the opening 509 similar in size to the individual pixel elements 518 of the pixel array 516 would maximize the amount of light striking the pixel array 516 while keeping the resulting image sharp. Increasing the size of the opening 509 beyond the size of the individual pixel elements 518 would allow more light to be collected, but would blur the image. Decreasing the size of the opening would let through less light and reduce the ability of the camera 501 to operate in dim environments. The dimensions of the optical structure 503, including the thickness of the transparent material 505 and the size of the opening 509, may vary with the specific implementation and may differ from what is suggested in FIG. 5A. In this regard, the size of the opening 509 may need to be adjusted according to the thickness of the transparent material 505.

The resulting optical structures may then be attached to the image sensors by using an adhesive at the edges of the optical structure 503. The adhesive may be opaque to prevent light from seeping into the transparent material 505 from the side and thus serve as opaque material 517.

Alternatively, the mounting of the optical structure 503 onto the image sensor 515 may also be accomplished by using a clear adhesive between the transparent material 505 and the image sensor 515. This latter method allows for easy manufacturing: An array of opaque masks may be first printed in bulk on a sheet of transparent plastic. The sheet may be cut into individual optical structures. Clear adhesive may be deposited onto each image sensor. Lastly each optical structure may be pressed onto its image sensor with enough force to spread the adhesive thin across the whole area of contact. In this latter case, the adhesive could be transparent or, if a slight scattering of light is tolerable (or desired), the adhesive could be translucent. Depending on the specific implementation, additional opaque coating may be placed at the edges to block light from entering the optical structure 503 from the side.

Because the refractive index of the transparent material 505 is greater than the refractive index of the surrounding environment, the resulting camera can image over a wider field of view than what is practical using a single lens element as shown in FIG. 1. This is due to the critical angle $\theta_c$ that results from Snell's law, as discussed above. Light approaching the opening 509 from an angle of incidence of almost 90°, e.g. almost horizontal, will refract into the transparent material 505 with an angle of incidence less than $\theta_c$ in magnitude. The field of view of the camera having a substantially flat optical structure 503 can thus be almost 180° or hemispheric. The image may be distorted and dimmed at these larger angles, but this distortion may be corrected using standard image processing techniques well known in the art.

A single aperture low profile camera may be realized using other implementations. For example the transparent material 505 may be made from a material other than glass or plastic, and the opaque mask 507 may be made from a variety of materials. The transparent material 505 may alternatively be curved or have a shape other than a flat sheet. As another variation, the optical mask 507 may be fabricated from a separate piece or sheet of opaque material, and then mounted onto the transparent material 505. Furthermore, the opaque mask 507 may, in some variations, be placed inside the transparent material 505 but with some transparent material between the opaque mask and the pixel array 516. The opening 509 may be a shape other than a hole or a square, and there may be more than one opening in the opaque mask, as will be discussed below.

Figure 5C:
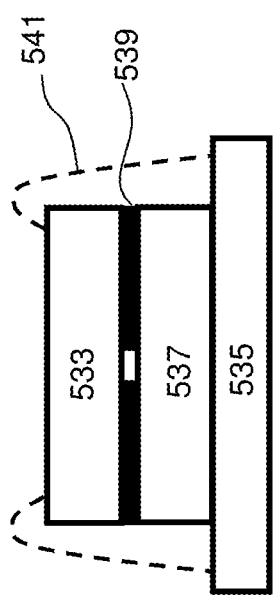
FIG. 5C depicts an exemplary single aperture low profile camera with protective transparent material.

Several variations of the exemplary single aperture low profile camera 501 will now be considered. In many applications it is desirable to protect the opaque mask 507 from the environment with a coating or covering. This may be achieved by placing another transparent material on top of the opaque mask 507. An example is shown in FIG. 5C, which depicts an exemplary single aperture low profile camera 531 with protective transparent material 533. The camera 531 is similar to camera 501 and has an image sensor 535, transparent material 537 mounted on the image sensor 535, and an opaque mask 539 disposed on the transparent material 537. However camera 531 includes additional transparent material 533 disposed on top of the opaque mask 539 to protect it. Additional opaque material 541 may be added at the edge of the two transparent materials 533 and 537 to prevent light from entering from the side. Accordingly, exemplary camera 531 may have the same wide field of view imaging properties of exemplary camera 501, but with additional protection for the opaque mask 539.

Figure 5D:
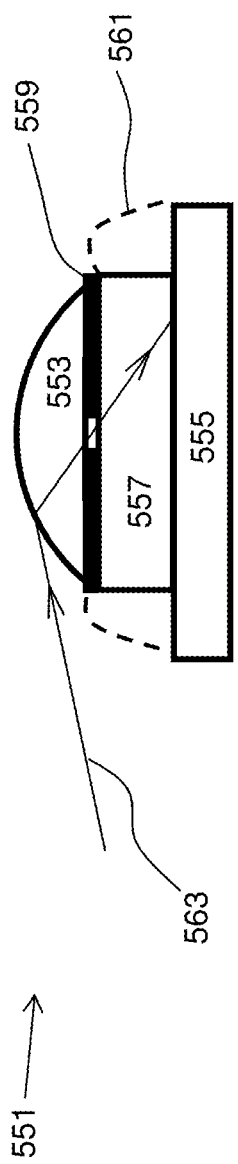
FIG. 5D shows an exemplary single aperture low profile camera with a lens on top of the opaque mask.

Another variation based on the camera 531 of FIG. 5C is to replace the second piece of transparent material 533 with a lens or form it as a lens. FIG. 5D shows an exemplary single aperture low profile camera 551 with a lens 553 on top of the opaque mask 559. Exemplary camera 551 comprises an image sensor 555, transparent material 557, an opaque mask 559, and optional opaque material 561 as discussed above. The lens 553 may additionally provide protection to the opaque mask 559. Advantageously, the lens 553 may be used to alter the field of view of the exemplary camera 551 including widening the field of view to more than 180 degrees. This is depicted by ray 563 which enters lens 553, passes through the opening in the opaque mask 559, and strikes the image sensor 555. In practice, the lens 553 may be a small lens on the order of one or several millimeters in diameter, or smaller or larger depending on the specific application. The lens 553 may be constructed of glass or plastic or another clear material. Alternatively, the lens 553 may be constructed using optically clear glue by depositing a small drop of glue onto the opaque mask 559 and then allowing the glue to harden.

Figure 5E:
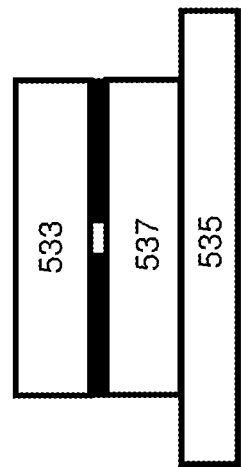
FIG. 5E depicts a variation of the single aperture low profile camera of FIG. 5C in which the opaque mask is attached to the protective transparent material.
Figure 5E:
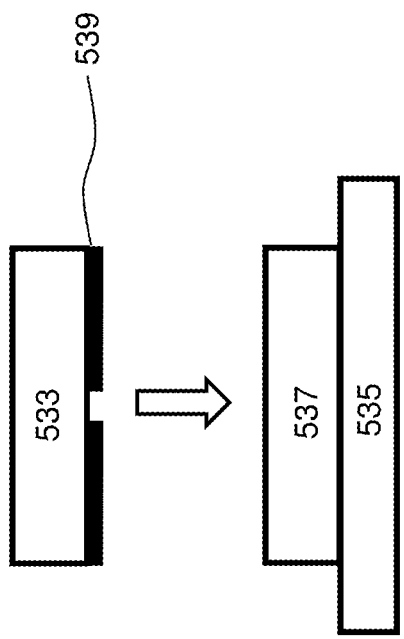

The opaque mask 539 described above may be printed on or attached to the transparent material 537 in the same manner as described above with the optical structure 503 of FIG. 5A. Alternatively, the opaque mask 539 may be attached to transparent material 533 as is shown in FIG. 5E. The opaque mask 539 and the piece of transparent material 533 may then be placed onto the first piece of transparent material 537 as shown in FIG. 5E. This variation allows the protective piece of transparent material and an opaque mask to be easily mounted onto an image sensor and then later removed and replaced with a different mask that is appropriate for a specific application.

Above it was described that it is beneficial for opaque material 517 to be placed at the edges of the transparent material 505 to prevent light from entering it from the side, but in some implementations opaque material 517 is not needed. FIG. 5F shows an opaque enclosure 568 surrounding the single aperture low profile camera 501 of FIG. 5A. As shown in FIG. 5F, the opaque enclosure 568 encloses the entire camera 501 except for the opaque mask 507 and the opening 509. Opaque material 517 is no longer needed if there is such an opaque enclosure since the enclosure 568 prevents light from entering the transparent material 505 except through opening 509. The opaque enclosure 568 may include other electronics, and for example be a case for an electronic product or consumer gadget incorporating the camera 501.

Figure 5G:
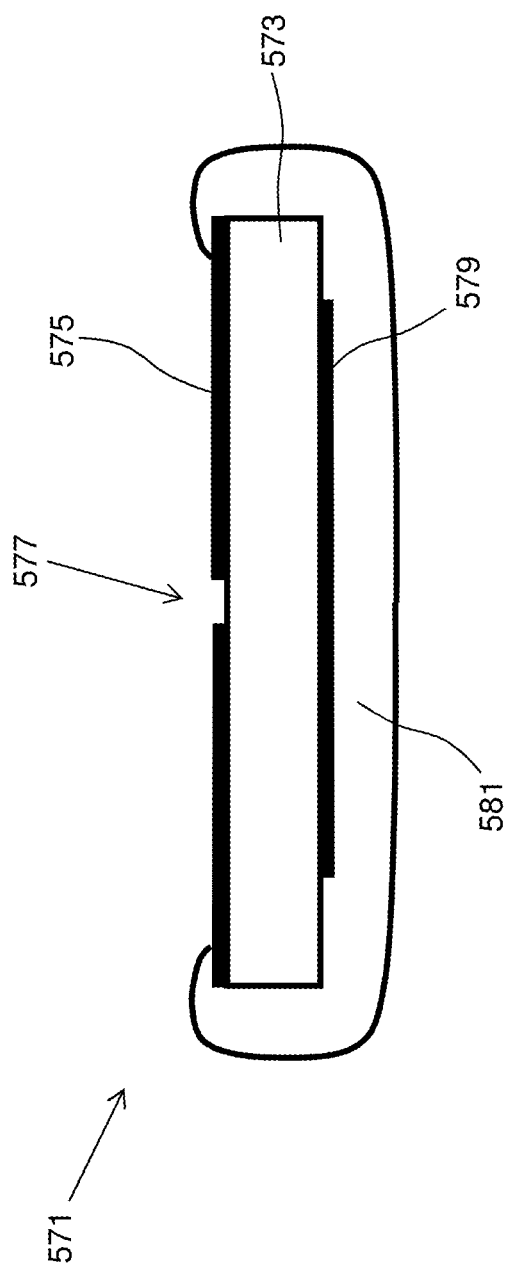
FIG. 5G shows an exemplary low profile camera having an integrated image sensor and transparent material.

Another variation of the exemplary camera 501 may be fabricated by forming the image sensor on the transparent material. FIG. 5G shows an exemplary low profile camera 571 having an integrated image sensor and transparent material. Camera 571 comprises a piece of transparent material 573, a substantially opaque mask 575 having an opening 577, an image sensor 579, and the opaque surround material 581. The opaque mask 575 may be disposed onto the transparent material 573 using any of the techniques already discussed above. In this exemplary embodiment, the image sensor 579 is integrated with transparent material 573 and may be placed on the surface of the transparent material 573 or even inside, as long as there is transparent material between the image sensor 579 and the opaque mask 575. For example, the transparent material 573 may be composed of sapphire or another transparent insulator, and the image sensor 579 may be a semiconductor circuit formed on or in the transparent material 573 using silicon-on-sapphire (SOS) or silicon-on-insulator (SOI) semiconductor fabrication techniques. Alternatively, the transparent material 573 may be a transparent flexible substrate and the image sensor 579 may be a circuit formed or printed on it. The opaque surrounding material 581 may serve the function of both protecting the image sensor 579 and ensuring that the only substantial light striking the image sensor 579 is light that has passed through the opening 577. The opaque surrounding material 581 may be formed with an opaque encapsulant, case, or coating.

The exemplary single aperture low profile camera 501 structure shown in FIG. 5A has adequate light sensitivity and resolution for many applications. The resolution of camera 501 may be increased by making the transparent material 505 thicker, or by decreasing the size of pixel elements 518 on pixel array 516 and decreasing the size of the opening 509. However performing either of these modifications would reduce the amount of light collected per pixel and hence reduce light sensitivity. An alternative approach will be discussed next.

Figure 6A:
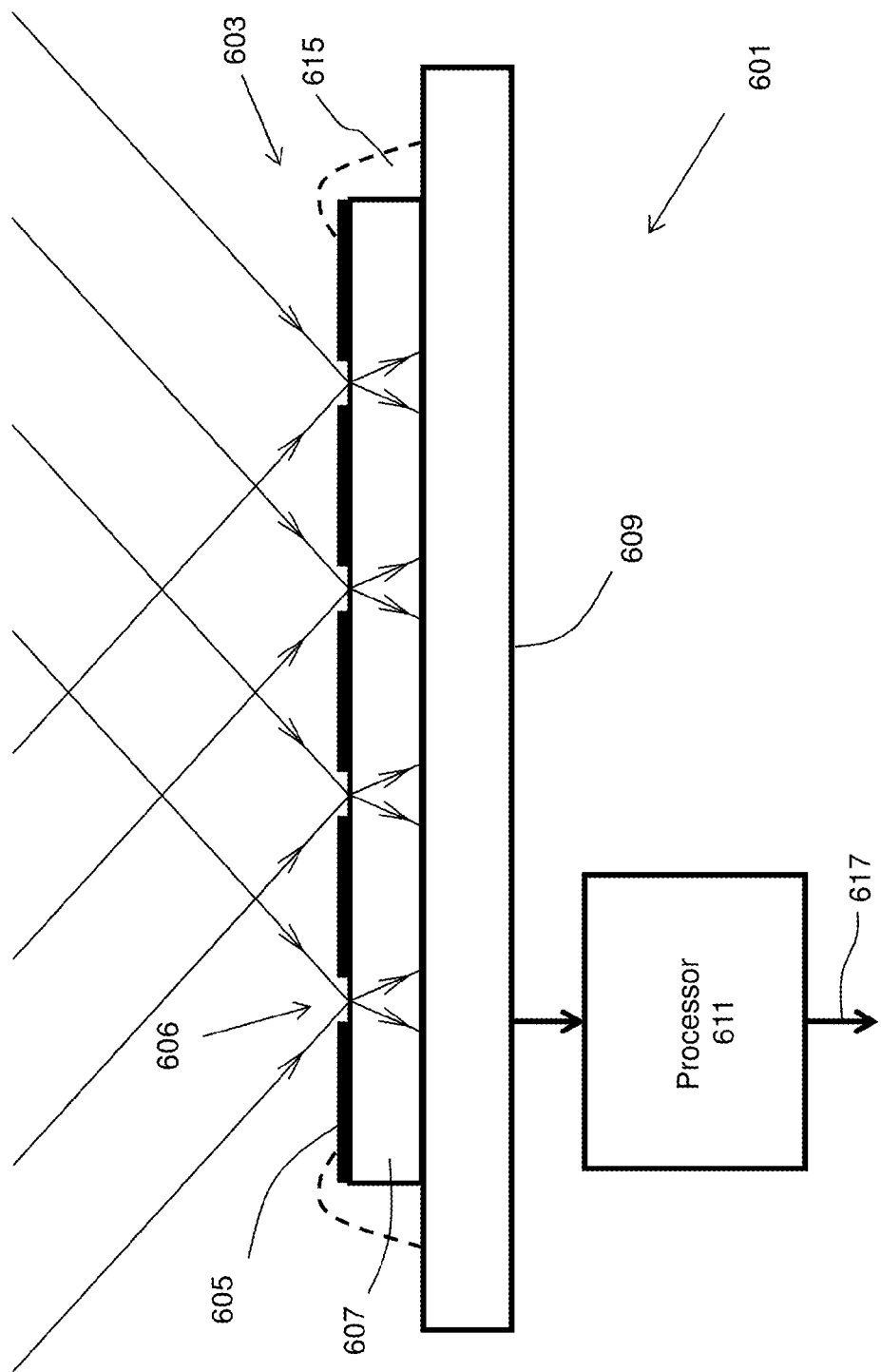
FIG. 6A depicts a cross section of an exemplary multiple opening low profile camera.
Figure 6B:
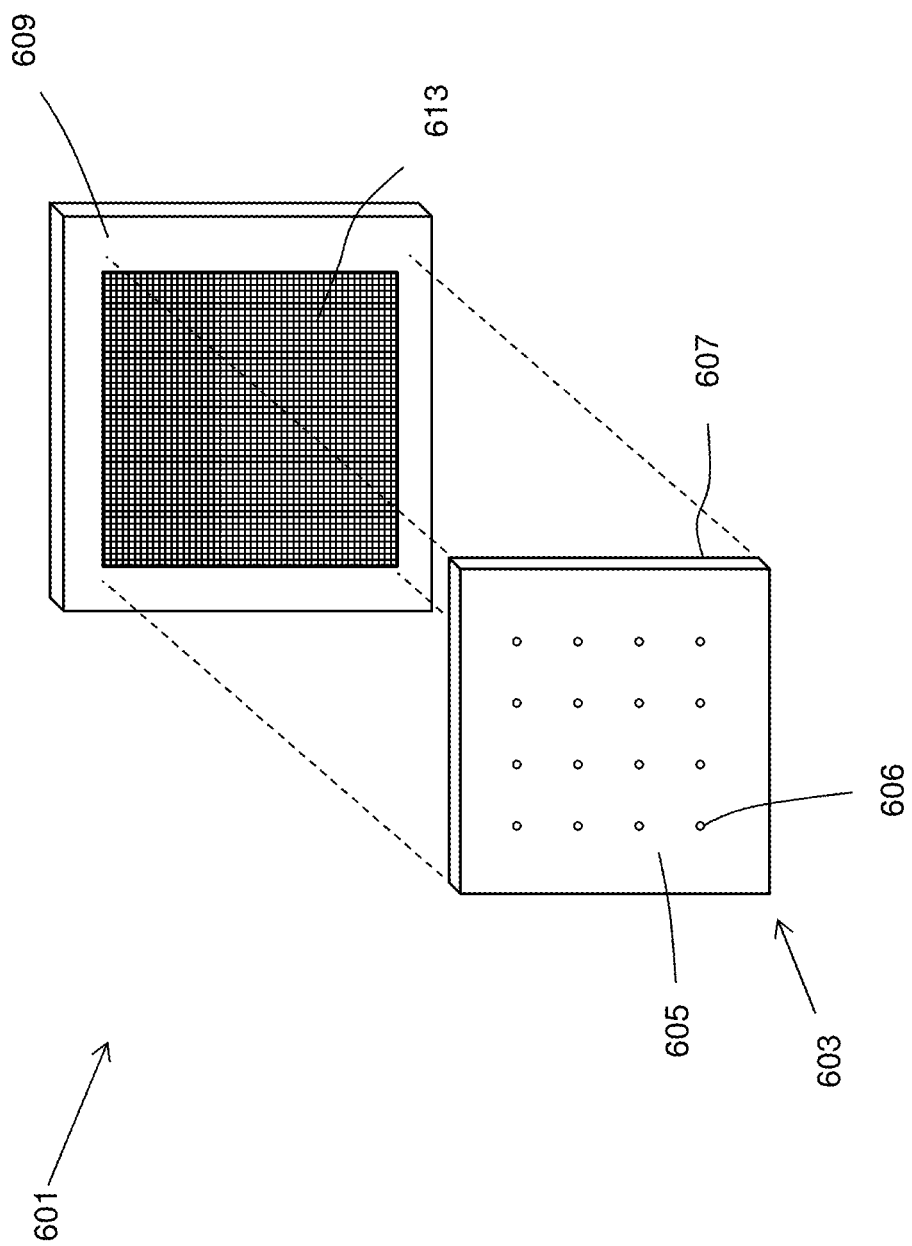
FIG. 6B shows an exploded view of the exemplary multiple opening low profile camera of FIG. 6A.

FIGS. 6A and 6B depict an exemplary multiple opening low profile camera 601. FIG. 6A shows a cross section view and FIG. 6B shows an exploded view of it. The exemplary multiple opening low profile camera 601 may be constructed in a similar manner as the exemplary single aperture low profile camera 501 discussed above. Such manufacturing steps need not be repeated.

The low profile camera 601 comprises an optical structure 603 and an image sensor 609 having a pixel array 613. The optical structure 603 comprises an opaque mask 605 placed on one side of transparent material 607 and thus may be similar to the optical structure 503 of FIG. 5A. Optional opaque material 615 may be used to prevent light from leaking into the sides of the transparent material 607, much like the opaque material 517 of FIG. 5A. The other side of transparent material 607 may rest on an image sensor 609. However the opaque mask 605 is different from the opaque mask 507 of FIG. 5A in that it has more than one opening. The opaque mask 605 may be fabricated in a manner similar as that of opaque mask 507 except for having a plurality of openings. In the exemplary embodiment shown in FIGS. 6A and 6B, the opaque mask 605 has a four-by-four array of openings. Other array sizes may be utilized as well. Opening 606, for example, may correspond to one of the openings in the opaque mask 605. Light enters through the openings in the opaque mask 605 and illuminates the pixel array 613 beneath it on the image sensor 609.

Processor 611 may be connected to the image sensor 609 in order to readout and process an image captured by it. The combination of the optical structure 603, the image sensor 609, and the processor 611 forms a camera. Processor 611 operates the image sensor 609, receives an image from the pixel array 613, processes the image, and generates an output 617. For purposes of discussion, the image obtained by the processor 611 from the pixel array 613 will be referred to as a "raw image."

Figure 3:
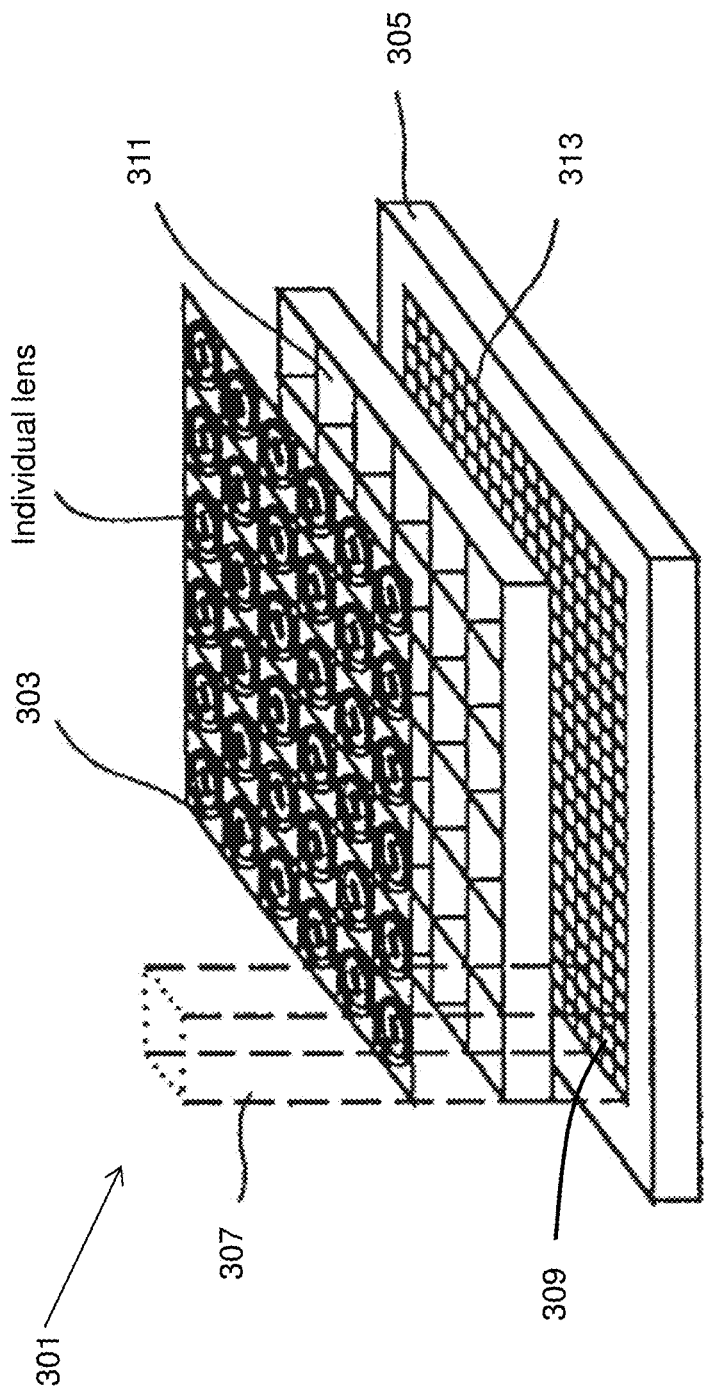
FIG. 3 depicts a prior art TOMBO camera.
Figure 4:
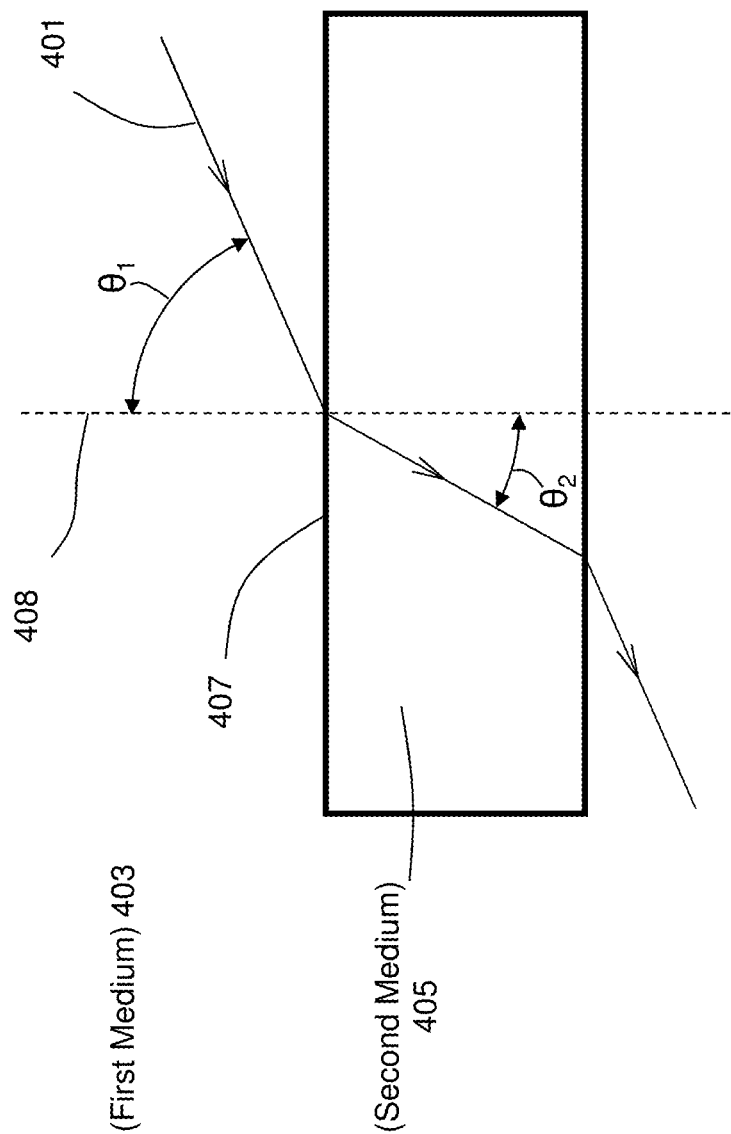
FIG. 4 illustrates Snell's Law.
Figure 6C:
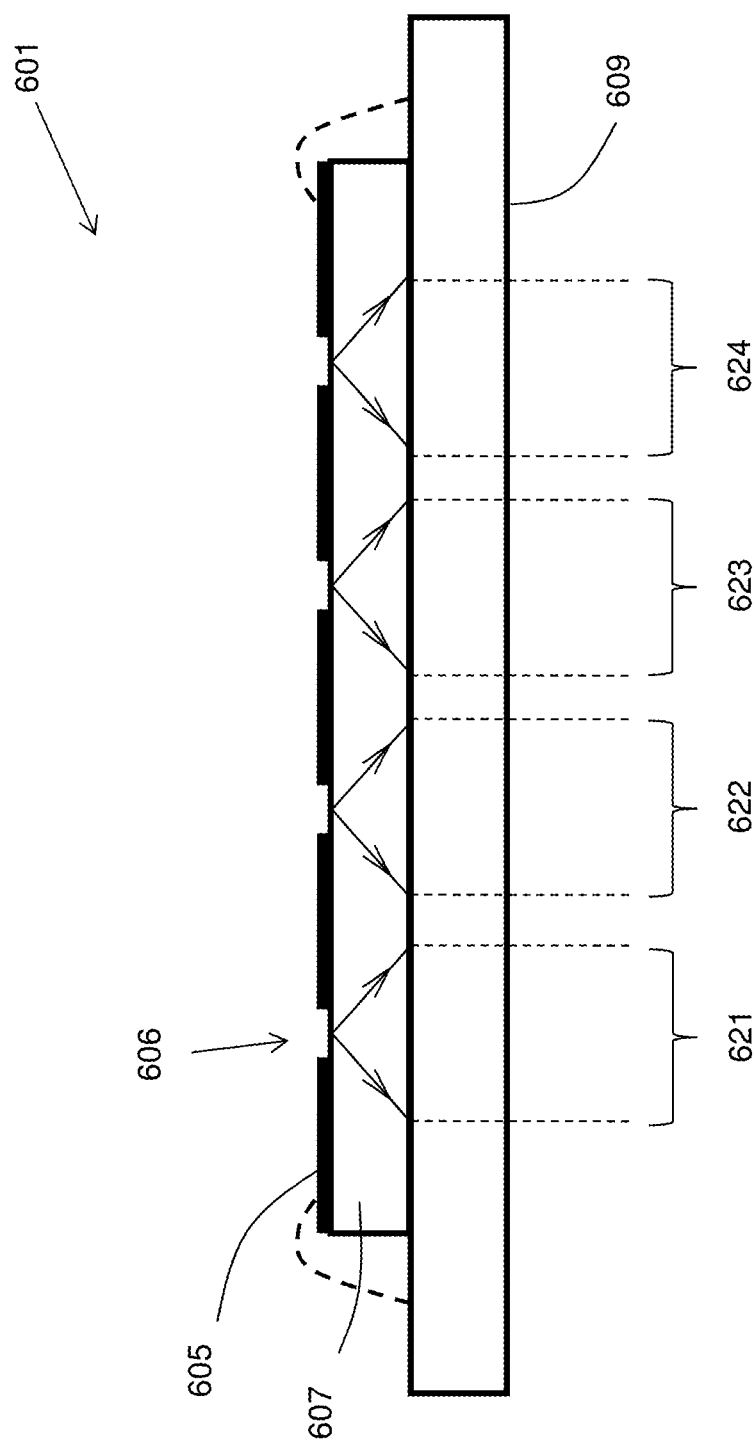
FIG. 6C depicts subimage regions on the pixel array caused by the openings in the opaque mask of the exemplary multiple opening low profile camera.

When camera 601 is exposed to a visual environment, the pixel array 613 will be illuminated with a plurality of subimages (e.g. subimages 621, 622, 623, and 624) where each subimage is formed by light illuminated through a respective opening. FIG. 6C depicts subimage regions on pixel array 613 caused by the openings in the opaque mask 605 of the camera 601. FIG. 6C shows the same cross section view of exemplary camera 601 as FIG. 6A. For example, light passing through opening 606 will illuminate subimage region 621. Subimage region 621 thus may be analogous to the region on pixel array 516 illuminated through opening 509 in the exemplary single aperture low profile camera 501 of FIG. 5A. In the exemplary embodiment, the openings in opaque mask 605 may be placed sufficiently far apart that the subimages caused by the openings will not overlap. This is possible due to the critical angle effect discussed above that results from Snell's law. If the transparent material 607 has a higher index of refraction than the surrounding environment, then light passing through an opening, once it passes into the transparent material 607, is confined to an angle of incidence less than $\theta_c$ as described above. The dimensions of the optical structure 603, including the size of the openings, the distance between openings, and the thickness of the piece of transparent material 607, may vary with the specific implementation. FIG. 6C therefore illustrates one significant advantage of the camera 601 of FIG. 6A over the prior art. The optical isolation between adjacent openings is provided by refraction, without the need for any restricting structure 311 as shown in FIG. 3.

The size and shape of openings in the opaque mask 605 may be selected using similar considerations as that of opaque mask 507. In the exemplary embodiment, the openings in opaque mask 605 may be square or circular shaped and similar in size to the pixel circuits in pixel array 613.

The non-overlapping subimage principle discussed above does not factor stray light that may result from diffraction, reflections off the edge of the opaque mask 605 at an opening, or imperfections inside or at the surface of the transparent material 607. However in practice, if the openings are sufficiently large and if the construction of the transparent material is of sufficient quality, then such stray light will have a negligible effect on the image data acquired by the image sensor 609.

Figure 7B:
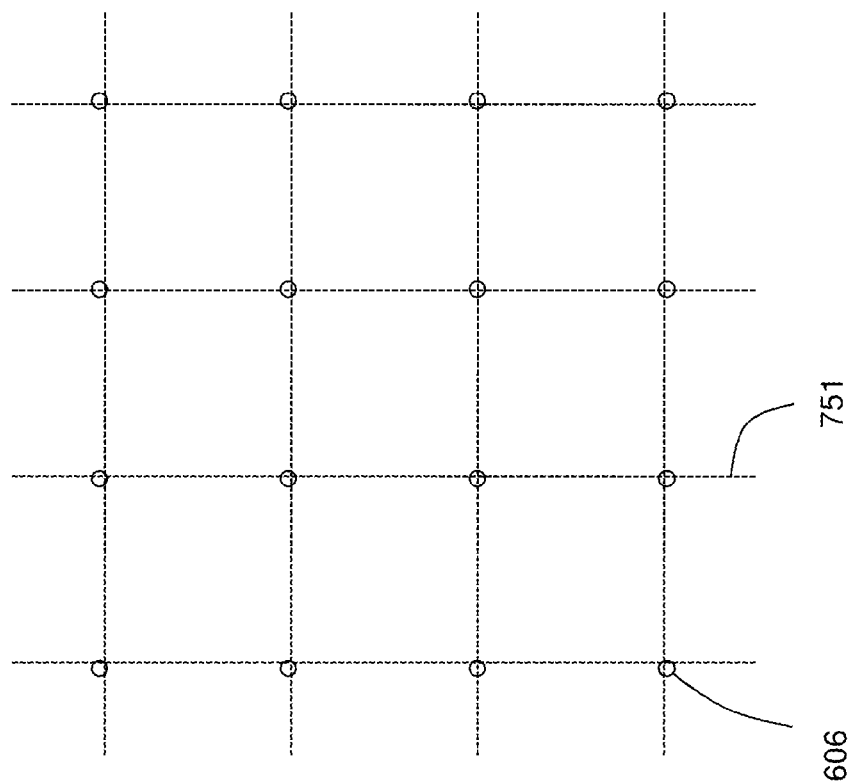
FIG. 7B illustrates exemplary spatial dither in the locations of openings in the opaque mask of FIG. 6A.
Figure 7A:
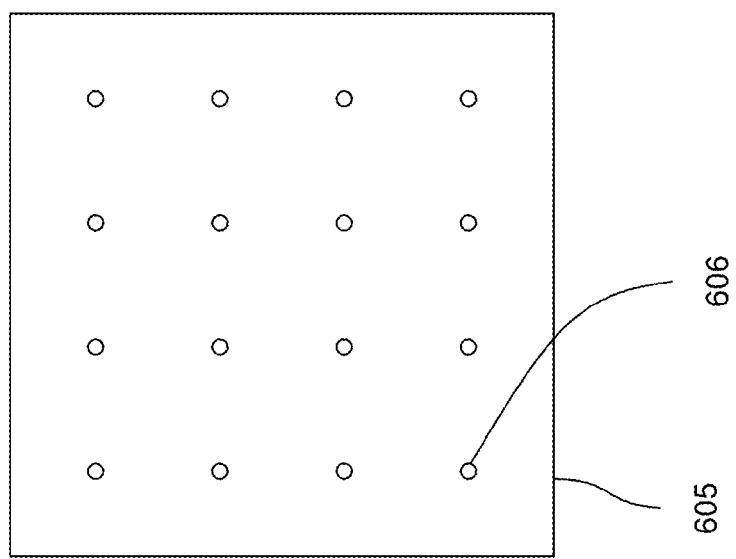
FIG. 7A illustrates the top view of the opaque mask of FIG. 6A.

FIGS. 7A and 7B depict spatial dithering in the locations of the openings in opaque mask 605. FIG. 7A illustrates the top view of the opaque mask 605 of FIG. 6A. FIG. 7B illustrates exemplary spatial dither in the locations of openings in the opaque mask 605 of FIG. 6A. The grid 751 indicates the alignment of the pixel array 613 on the image sensor 609. Each of the lines of grid 751 is separated by a distance equal to a multiple (e.g., integer multiple) of the pitch between pixels on the image sensor 609. This integer multiple may be a number such as 20 pixels, 32 pixels, or another integer depending on the specific implementation. For example, if the pixel pitch is 10 microns, the lines of grid 751 may be 200 microns, 320 microns, or another multiple of 10 microns apart.

It is possible to configure the opaque mask 605 so that each opening is located exactly at the intersection of a horizontal and a vertical line, e.g. with no dither. The grid lines would then be far enough apart to ensure that the resulting subimages are substantially nonoverlapping. In this case, with the openings perfectly aligned with the grid 751 the subimages would be identical.

However, in the exemplary embodiment the openings may instead be displaced from grid 751 by fractional pixel amounts. This is shown in FIG. 7B. For purposes of discussion, this displacement of openings from the grid 751 will be referred to as spatial dithering. This will cause the subimages associated with different openings to be similar but displaced by a fractional pixel amount. The advantages of spatial dithering in the openings will be discussed below. The actual spatial dithering may be systematic, e.g. so that the first, second, third, and fourth rows of openings are shifted up by 0.5, 0.25, 0, and −0.25 pixels respectively. For example, if the pitch between pixels is 10 microns, the respective spatial dithering applied to the rows of openings may be 5 microns, 2.5 microns, 0 microns, and −2.5 microns. Columns of openings may likewise be similarly shifted left and right. The spatial dithering may also be random, where each opening is displaced horizontally and vertically by a random fractional pixel amount. For example, if the pixel pitch is 10 microns, each opening may be randomly displaced to any location within a ten by ten micron square centered about the original location. Alternatively, the openings may simply be randomly placed throughout the mask area, provided that the openings are sufficiently far apart.

Another manner of obtaining spatial dither is to position the optical structure 603 so that it is rotated with respect to the image sensor 609. This method is discussed further below in FIG. 17. The above benefits of spatial dither may then be obtained using an array of openings that are themselves not spatially displaced with respect to the piece of transparent material 607. This approach may be combined with the other techniques above to produce spatial dither. As long as the locations of the openings in the opaque mask 605 are spatially dithered with respect to grid 751, the benefits of spatial dither may in many cases be obtained. Note that for mass assembly, the tolerances with which the optical structure 603 may be placed on the image sensor 609 may be such that such rotation is inevitable. In this case, such imprecision in manufacture may in fact be beneficial.

Figure 8A:
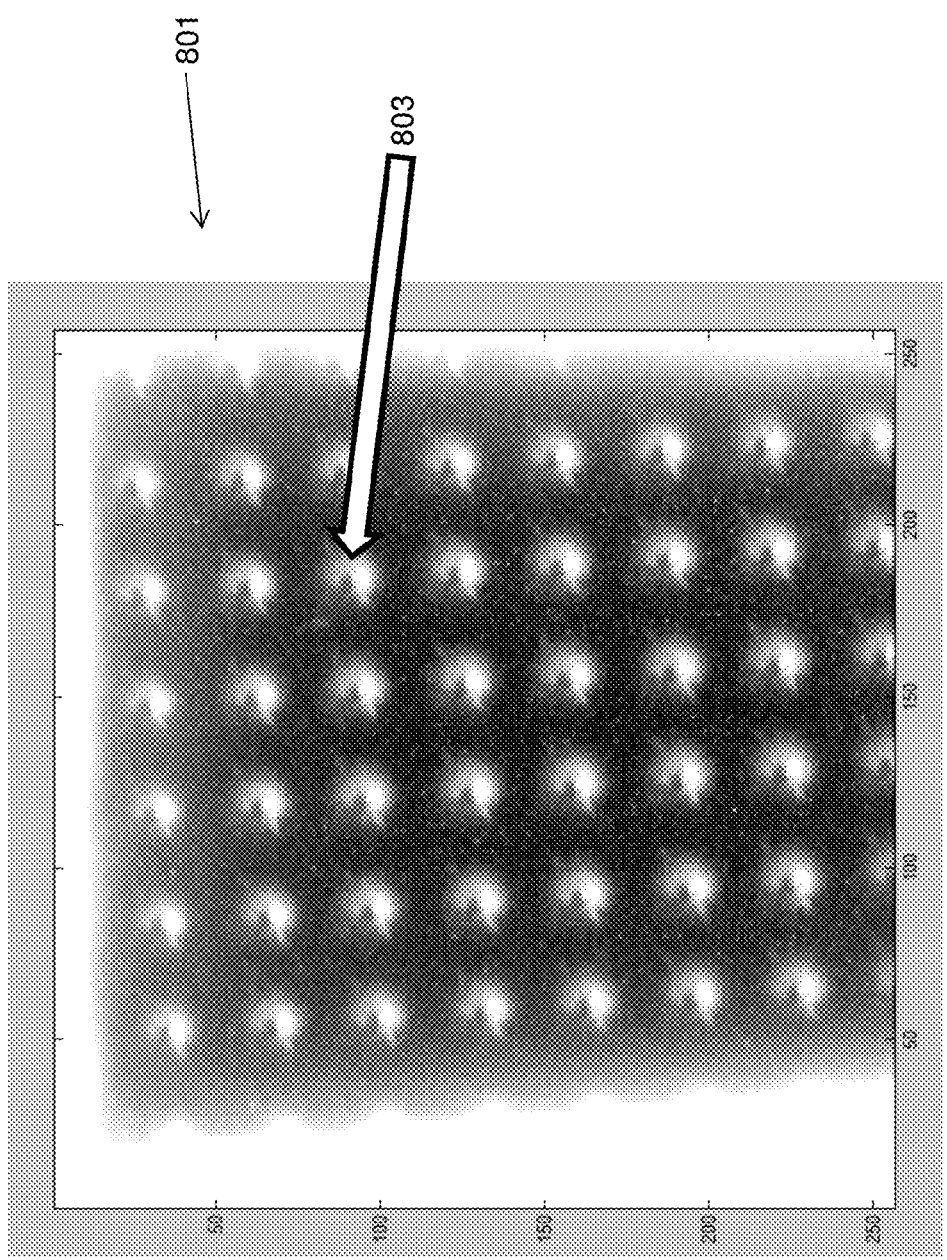
FIG. 8A depicts an exemplary raw image of the type that may be acquired by the image sensor of FIG. 6A.

FIG. 8A depicts an exemplary raw image 801 of the type that may be acquired by the pixel array 613 of FIG. 6A. The resulting image contains a plurality of subimages, one for each opening in the opaque mask 605. Subimage 803, for example, is one of the plurality of subimages. Note that in FIG. 8A, the area between subimages is dark. These dark areas are regions beyond the critical angle $\theta_c$ of all openings. Therefore, in raw image 801 the distances between openings in the opaque mask 605 are large enough, for the transparent material's thickness and refractive index, to cause the subimages to be substantially nonoverlapping. For the image sensor that produced raw image 801, the pixel pitch of the pixel array was 17.1 microns, the transparent material 607 was cut from a sheet of Kodak Accumax ARD7 sheet that is 178 microns (0.007 inches) thick, and the lines of grid 751 were about 32 pixels or about 547.2 microns apart, plus spatial dithering.

Figure 8B:
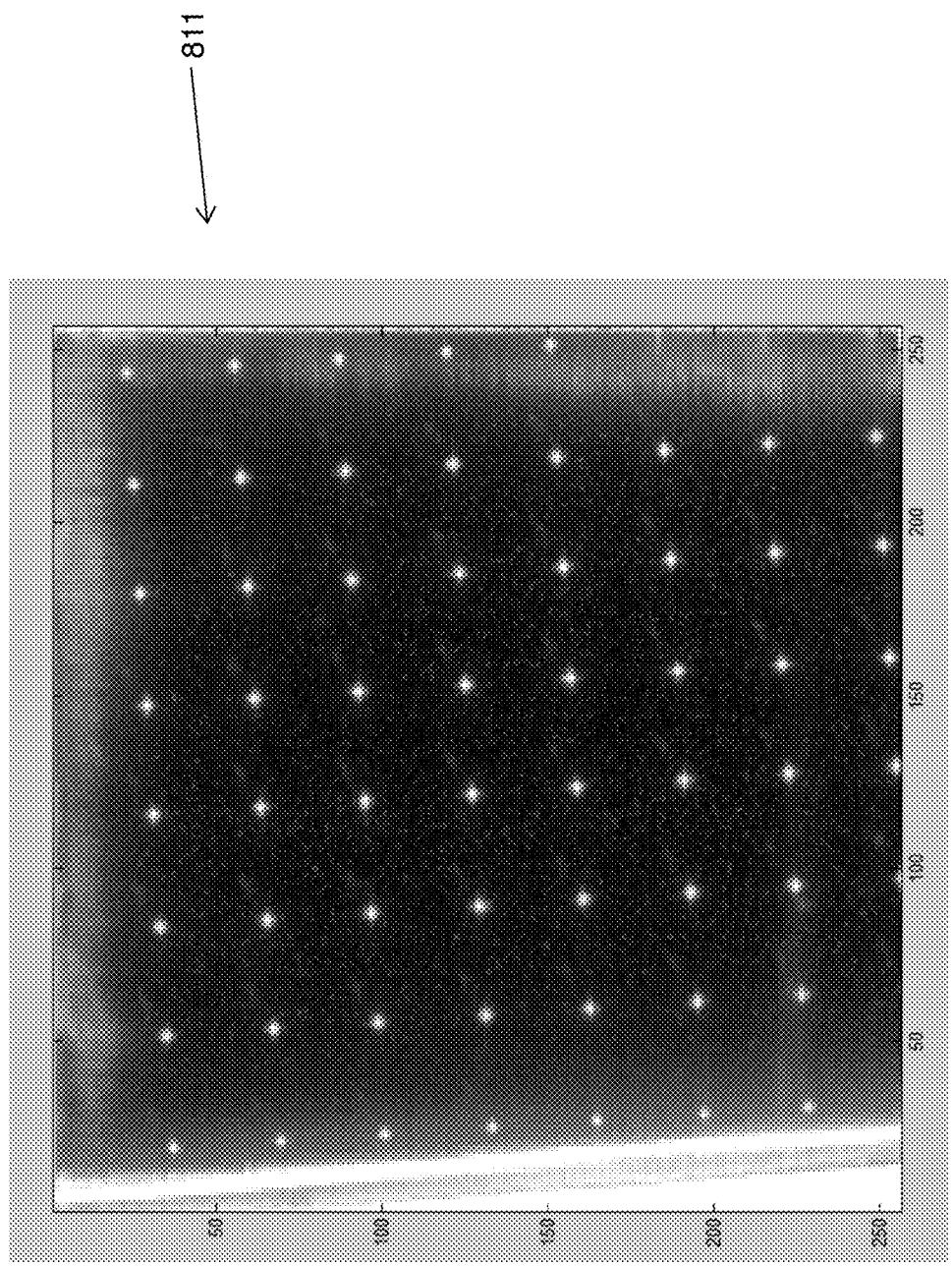
FIG. 8B illustrates an exemplary raw image of the type that may be acquired by the image sensor of FIG. 6A in response to a point source of light.

FIG. 8B illustrates an exemplary raw image 811 of the type that may be acquired by the image sensor 609 of FIG. 6A in response to a point source of light. Such an image may be obtained in a calibration step to determine the locations of openings in the opaque mask 605. The point source of light may be located perpendicularly above the opaque mask 605 and may be produced by a light emitting diode or other light source. It is beneficial for the distance between the point source of light and the opaque mask 605 to be adequately large such that stereo disparity in the subimages of different openings is negligible. The generated image would comprise an array of bright spots that correspond to the mask openings. The locations of these bright spots, which may be determined by the location of the brightest pixel of each spot, may be used to obtain initial estimates of the locations of the individual subimages and therefore the openings in the opaque mask 605.

Figures 9A, 9B:
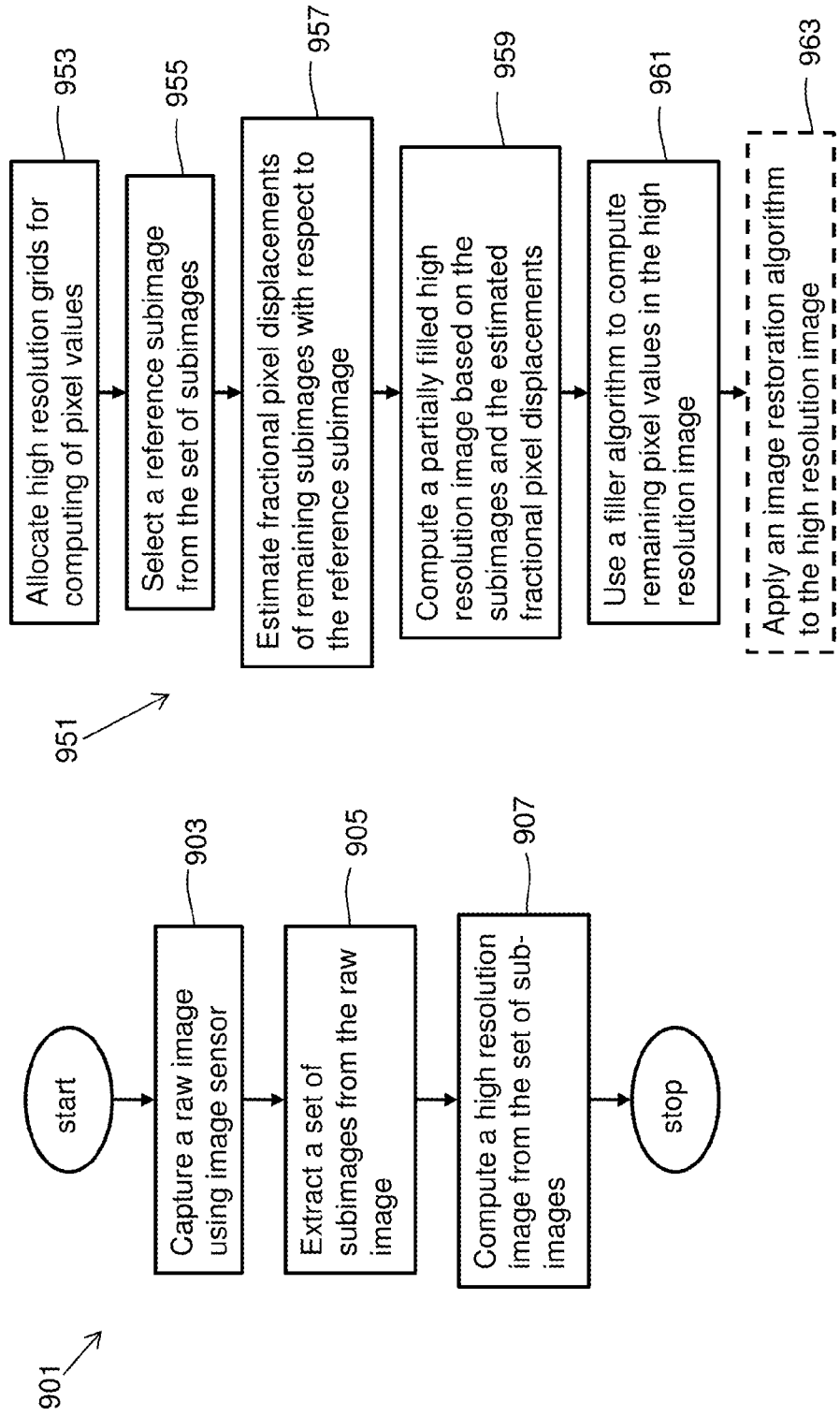
FIG. 9A depicts an exemplary process flow for reconstructing a high resolution image from a raw image.
FIG. 9B depicts an exemplary algorithm that may be used to implement the third step of FIG. 9A.

In the exemplary embodiment, a high resolution image may then be constructed from the raw image data acquired by the image sensor 609. FIG. 9A depicts an exemplary process flow 901 for reconstructing a high resolution image from a raw image such as that which might be obtained from image sensor 609. This process may run as an algorithm on processor 611. The first step 903 of this process is to collect light and generate the raw image seen by the pixel array 613 on image sensor 609. For example, this would produce an image that may be similar in nature to the image 801 of FIG. 8A.

The second step 905 of this process is to extract a set of subimages from the raw image. One subimage may be extracted from the area under each opening in the opaque mask 605. The size of the subimage may be large enough to capture all pixels illuminated through the subimage's opening, but small enough to not capture pixels illuminated through adjacent or other openings. The measured locations of openings obtained previously by a point source of light, for example as in the discussion of FIG. 8B above, may be used to assist with the extraction of these subimages from the raw image.

The third step 907 of this process is to compute a high resolution image from the set of subimages. This step may be performed using a superresolution algorithm that is capable of constructing a high resolution image from a set of lower resolution images all looking substantially at the same scene. The implementation of such superresolution algorithms is a well established art. U.S. Pat. No. 7,248,751 (incorporated herein by reference in its entirety), entitled "Algorithmic technique for increasing the spatial acuity of a focal plane array electro-optic imaging system" by Schuler et al., describes an exemplary algorithm that may be used for step 907. Such algorithms have found use in other image processing applications in which, for example, a video camera mounted on a moving platform observes a scene. The video camera would generate a video sequence of images that are all substantially the same except for subpixel displacements, also known as spatial dither, which result from the video camera being in a slightly different position each frame. Using a superresolution algorithms, it is possible to reconstruct a higher resolution image of the environment from the video sequence. In the exemplary process 901, instead of reconstructing a high resolution image from a sequence of lower resolution video frames, in which each frame was acquired at a different time, the high resolution image is reconstructed from the set of subimages that were acquired simultaneously in step 903.

FIG. 9B depicts an exemplary algorithm 951 that may be used to implement step 907 of process 901. This exemplary algorithm 951 is a variation of the resolution enhancement algorithm mentioned in the aforementioned U.S. Pat. No. 7,248,751.

The program listing below is the MATLAB® source code of an exemplary algorithm capable of reconstructing a high resolution image from a raw image of the type captured by the image sensor 609. In the exemplary embodiment, this algorithm runs on the processor 611 and generates the output 617. Although MATLAB® was chosen for illustrative purposes, the algorithm may be written in any other appropriate computer language. The program listing below includes both the source code and comments explaining the algorithm's function. Also listed is the MATLAB® source code of an optical flow function "ii2" capable of measuring subpixel displacements between two images. The function "ii2" is based on Mandyam Srinivasan's "Image Interpolation Algorithm (IIA)" which is disclosed in the publication "An image-interpolation technique for the computation of optical flow and egomotion", pages 401-415 of the September 1994 issue of Biological Cybernetics (Vol. 71, No. 5, and incorporated herein by reference in its entirety). Other optical flow algorithms may be used in place of function "ii2", for example the well known Lucas Kanade algorithm originally introduced in the conference publication "An iterative image registration technique with an application to stereo vision" by Bruce Lucas and Takeo Kanade, from the Proceedings of Image Understanding Workshop, pp. 121-130 (1981), and incorporated herein by reference in its entirety.

```
% ============================================================
% MATLAB program to reconstruct a high resolution image from
% an image tiling produced by a camera such as that shown in
% FIG. 6A
% Start: The program begins with matrix A loaded. Matrix A
% is the raw image of pixels grabbed from the image sensor.
% We are assuming that all valid pixel values are positive
% e.g. one or greater.
% ============================================================
% PART A: Set up locations of sub-images
% bases(j,1) and bases(j,2) are respectively the m and n
% locations of the center point of subimage j, quantized to
% integer values. The values shown below for bases is an
% actual set of values used in one prototype. Obviously for
% other prototypes the entries and the number of entries
% will be different.
bases = [
    65,85
    63,118
    97,87
    95,120
    61,149
    59,182
    93,151
    91,183
    129,89
    127,121
    161,91
    159,124
    125,153
    157,155
    123,185
    155,187
    193,93
    191,125
    223,128
    189,157
    221,159
    187,190
    218,191
    ];
% ============================================================
% PART B: Extract subimages from raw image A
numframes=length(bases); % number of sub-images to extract
                         % from raw image
% The variable "radius" defines the resolution of a
% sub-image. A sub-image will be one of the center points
% from "bases" plus a ring of pixels "radius" wide around
% the point. Thus the sub-image will be 2*radius+1 pixels
% wide and tall
radius = 5;
ws = 2*radius+1;
% The 3D matrix Y stores the sub-images extracted from the
% raw image
for f=1:numframes
    Y(1:ws,1:ws,f) = A((-radius:radius)+bases(f,1),...
        (-radius:radius)+bases(f,2));
end
% ============================================================
% PART C: Initialize variables to prepare for reconstruction
% Variable "upsampleamount" is the factor by which we will
% upsample
upsampleamount = 10;
% ym, yn, and yf may be computed from above, but are
% computed here using the "size" function for simplicity.
% This is to emphasize that a variety of algorithms could be
% used to reconstruct the high resolution image. Practically
% any superresolution algorithm that takes as input the
% stack of low resolution images stored in Y and
% reconstructs a high resolution image is a candidate
% algorithm, though of course which algorithm is best
% depends on the specific application, etc.
[ym,yn,yf] = size(Y);
% Over the next steps we will be computing the matrix Z, a
% superresolution image constructed from the sub-images
% stored in Y. Variables zm and zn denote respectively the
% sizes of Z. Variables Zcount and Zsum are intermediate
% matrices that are used to accumulate pixel values
% deposited into the Z matrix based on displacements between
% sub-images. Here we are allocating these arrays.
zm = (ym+2)*upsampleamount+1;
zn = (yn+2)*upsampleamount+1;
Zcount = zeros( zm , zn );
Zsum = Zcount;
% ============================================================
% PART D: Pixel displacements between sub-images: Let the
% first sub-image be the reference sub-image. Therefore its
% displacement is zero since it will have no displacement
% from itself. Function ii2 computes subpixel displacements
% between the reference sub-image and other sub-images.
for f=1:yf
    % ofn and ofm store respectively n- and m- direction
    % displacements
    [ofn(f),ofm(f)] = ii2(Y(:,:,1),Y(:,:,f),1);
end
% Note: ofn(1) and ofm(1) will respectively be zero, so we
% could just set these values to zero and save a few
% CPU cycles
% ============================================================
% PART E: Place sub-images into matrices Zcount and Zsum
% accordingly. Essentially upsample these images, and then
% place them onto these matrices offset by an amount
% determined by the measured displacements
for f=1:yf
    % Optional step: if ofm or ofn are too large in
    % magnitude, then skip this sub-image. This fix prevents
    % out-of-bounds matrix indexing errors.
    if ofm(f)>0.9 || ofm(f)<-0.9 || ofn(f)>0.9 || ofn(f)<-0.9
        continue;
    end
    % Compute image offset amounts.
    zoffm = upsampleamount+1;
    zoffn = upsampleamount+1;
    if f>=2
        % add offset from optical flow
        zoffm = zoffm - ofm(f)*upsampleamount;
        zoffn = zoffn - ofn(f)*upsampleamount;
    end
    zoffm = round(zoffm);
    zoffn = round(zoffn);
    % By this point zoffm and zoffn are the offsets in the
    % m- and n- directions.
    % Now apply the sub-images to the Z matrices
    for mm=1:ym
        for nn=1:yn
            mmm = (mm-1)*upsampleamount+zoffm;
            nnn = (nn-1)*upsampleamount+zoffn;
            Zcount(mmm,nnn) = Zcount(mmm,nnn) + 1;
            Zsum(mmm,nnn) = Zsum(mmm,nnn) + Y(mm,nn,f);
        end
    end
end
% ============================================================
% PART F: Compute matrix Zbase. This matrix will store a
% non-zero value for all pixels of the high resolution image
% that are known, and zero value for all pixels that are not
% known
Zbase = Zsum ./ (Zcount+eps);
% ============================================================
% PART G: Fill in unknown pixels. From Zbase we will
% construct Z by estimating the unknown (e.g. zero) values
% of Zbase. This could be performed by interpolation
% algorithm, for example. Here we will just grow the image
% using a weighted sum of surrounding pixels. Note that the
% set of steps shown below is just one possible method to
% fill out Z.
Z = Zbase; % Zbase is an initial estimate of Z
G = [2 3 2; 3 0 3; 2 3 2]; % weight matrix for growing
% Here we perform several growing cycles to fill out Z
growits=20; % number of growing cycles to perform-
            % optimized experimentally
Znew = Z;
for gi = 1:growits
    for mm=2:zm-1
        for nn=2:zn-1
            if Z (mm,nn)==0
                % Grow into this pixel
                Gwindow = Z(mm-1:mm+1,nn-1:nn+1);
                gsum = sum(sum( Gwindow .* G ));
                gcount = sum(sum( G .* (Gwindow>0) ));
```

```
            Znew(mm,nn) = gsum / (gcount + eps);
        end
    end
end
Z = Znew;
end
% Now we will fill out pixels at the periphery.
Z(:,1) = Z(:,2);
Z(:,zn) = Z(:,zn−1);
Z(1,:) = Z(2,:);
Z(zm,:) = Z(zm−1,:);
% Next is an optional set of steps that smooths Z slightly
% to remove the "plateaus" that may appear due to the
% growing algorithm. Matrix Ks is the smoothing kernel,
% which may be determine experimentally. We may have to
% crop the image slightly to remove the roll-off effects
% of the convolution, in particular if the final deblurring
% step is performed next.
if 1
    kssize=4;
    Ks = conv2( ones(kssize) , ones(kssize) );
    Ks = Ks / sum(Ks(:));
    Z = conv2( Z , Ks );
    % crop image
    Z = Z(kssize+1:zm−kssize,kssize+1:zn−kssize);
end
% At this point we have computed Z, the reconstructed
% high resolution algorithm. We could stop here and output
% Z, or we could go on to the next step to perform a
% deblurring algorithm.
% ============================================================
% PART H: Optional restoration step. This optional step uses
% a deblurring algorithm to attempt to sharpen the image Z.
% For this example, we will use the MATLAB function
% "deconvlucy", an implementation of the Lucy-Richardson
% deblurring algorithm available in the MATLAB "image
% processing toolbox". This function takes as input the
% matrix Z and a second argument, an initial estimation of
% the point spread function. For the latter argument we will
% use a square matrix equal to the upsampling
% amount. Other estimations may be more appropriate
% depending on the specific implementation. The matrix Q
% is the output.
psfestimate = ones(10)/10^2;
Q = deconvlucy(Z,psfestimate);
% END
% ============================================================
% ============================================================
function [ofx,ofy] = ii2 (X1,X2,delta)
% function [ofx,ofy] = ii2 (X1,X2,delta)
% computes optical flow using 2D variant of Srinivasan's image
% interpolation algorithm
%
% X1, X2 = first and second image frame
% delta = delta shift for computation
% ofx,ofy = returned optical flow in pixels
%
[fm,fn] = size(X1);
ndxm = 1+delta:fm−delta;
ndxn = 1+delta:fn−delta;
f0 = X1(ndxm,ndxn);
fz = X2(ndxm,ndxn);
f1 = X1(ndxm,ndxn+delta);
f2 = X1(ndxm,ndxn−delta);
f3 = X1(ndxm+delta,ndxn);
f4 = X1(ndxm−delta,ndxn);
A = sum(sum( (f2−f1).^2 ));
B = sum(sum( (f4−f3) .* (f2−f1) ));
C = 2*sum(sum( (fz−f0) .* (f2−f1) ));
D = sum(sum( (f2−f1) .* (f4−f3) ));
E = sum(sum( (f4−f3).^2 ));
F = 2*sum(sum( (fz−f0) .* (f4−f3) ));
mat = [A B; D E];
invmat = inv(mat);
xyhat = invmat * [C;F];
ofx = delta*xyhat(1);
ofy = delta*xyhat(2);
% ============================================================
```

The programming of the foregoing exemplary algorithm assumes that when it starts the matrix "A" already contains the two dimensional raw image captured by the image sensor 609. Matrix "A" may thus contain an image similar to that depicted in image 801. In other words, this exemplary algorithm assumes that step 903 has already been performed. Step 903 may be performed using any method of extracting a raw image from the image sensor 609. For purposes of explanation, assume that the image sensor 609 is monochromatic, and therefore pixel values may be encoded as real or integer valued intensities. However, these principles can be expanded to color or hyperspectral images. Also assume, without loss of generality, that the intensity values are denoted as positive values greater than zero.

The exemplary algorithm is divided into Parts A through H for purposes of discussion. The exemplary algorithm also requires a second matrix, "bases," which stores the locations of the openings of the opaque mask 605 and hence the center locations of the subimages generated by the corresponding openings. The values in "bases" may be computed from an initial calibration step using a point light source, as discussed above in conjunction with FIG. 8B. For example, the location of each hole may be estimated as the pixel location of the local maximum of the corresponding subimage in response to the point light source. Part A of the algorithm initializes the matrix "bases" in processor's memory.

Part B of the algorithm implements step 905 and extracts subimages from the raw image "A." In this exemplary algorithm, a group of pixels surrounding each subimage center point, stored in "bases", and the pixel(s) corresponding to the center point form a subimage. The plurality of subimages are stored in the three dimensional matrix "Y".

Parts C through H implement step 907, which as described may be split up into the sequence of steps 951 shown in FIG. 9B. Part C of the algorithm performs step 953 and defines the size of the output high resolution image, including the upsampling amount, and allocates matrices "Zcount" and "Zsum" that will be later used to construct the high resolution image.

Part D of the algorithm performs steps 955 and 957 and computes the fractional pixel displacements between subimages using the optical flow algorithm in the function "ii2." For step 955 the first subimage serves as the reference image while for step 957 displacement measurements are taken between the first subimage and other subimages and stored in vectors "ofm" and "ofn." The displacements correspond to estimations of the spatial dither in the locations of openings in the opaque mask 605, plus any additional dither that may result if the opaque mask 605 is not perfectly aligned with the image sensor 609. The contents of the "bases" matrix, plus these subpixel values, denote the estimated locations of the openings with respect to the grid 751 to a subpixel precision.

Displacement values do not need to be computed every time a new high resolution image is reconstructed since the displacements are a function of the physical camera and not the visual scene. If the camera is adequately rigid through its lifetime, the values in "ofm" and "ofn" may be computed during calibration, stored, and recalled from memory whenever needed. However, calibration may need to be repeated again if the camera deforms or changes shape due to factors such as warping, flexing, or thermal expansion. In such a variation to the exemplary embodiment, the calibration step may be performed with natural scenery or with a calibration pattern designed to help accurately measure the subpixel displacements that make up "ofm" and "ofn." In yet other variations, the values of "ofm" and "ofn" may be based on multiple raw images, to reduce the effects of any corrupting noise in the pixel values.

In order to enable the subpixel displacements to be accurately measured, it is beneficial to perform optical smoothing prior to acquiring the raw image with the pixel array 613. Such optical smoothing allows the effective receptive fields of adjacent pixels in the pixel array 613 to overlap, and thus increase the accuracy of the computations performed in function "ii2." This may be achieved by ensuring that the openings in the opaque mask 605 are approximately equal to the pitch between pixels in pixel array 613. For example, if the pixel pitch is 10 microns, then the openings in the opaque mask 605 may be approximately 10 microns square or larger or smaller. Moreover, the optimal opening size may depend on the nature of the texture in the visual field and may be empirically determined.

Parts E and F of the algorithm implement step 959 and generate a partially filled image "Zbase." Part E upsamples the subimages and deposits them into the matrices "Zsum" and "Zcount" along a lattice displaced by the displacements stored in "ofm" and "ofn." Part F computes an element-wise division of "Zsum" by "Zcount" and stores the result in "Zbase." The variable "Zbase" will have a non-zero value everywhere a subimage pixel was placed, and a zero value for all other pixels. The value "eps" is a small positive constant used to prevent division by zero and instead return a zero when the numerator is zero. Some of the non-zero values may result from one subimage, while others may result from more than one subimage. In the latter case, the resulting pixel is a mean of all contributing values.

In some cases where there is an adequate number of subimages and depending on the contents of "ofm" and "ofn", the subimage Zbase may be filled with non-zero values, either entirely or at least everywhere except near the edges.

Figure 10:
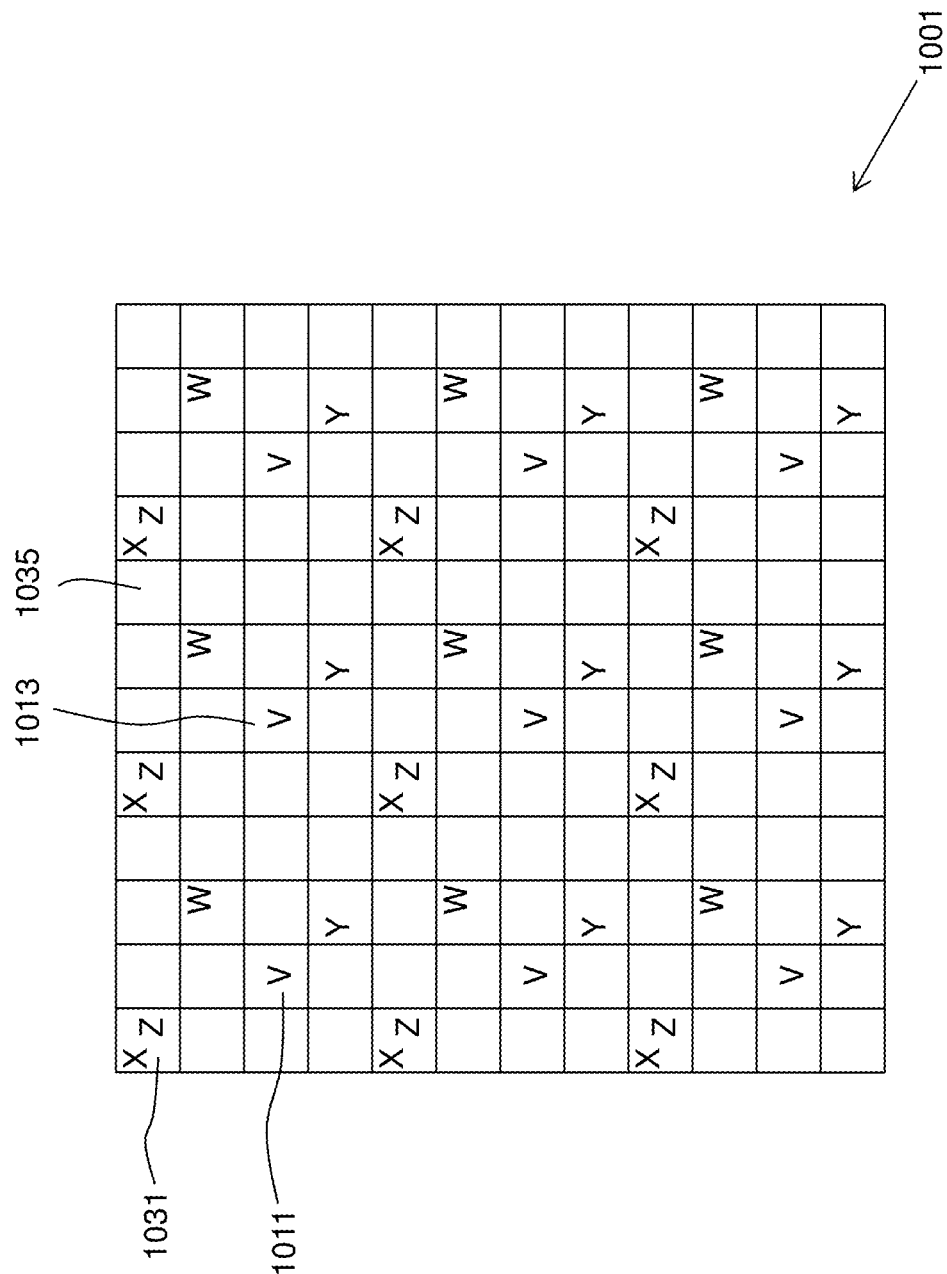
FIG. 10 depicts an exemplary array that may be used to explain the computation of matrices "Zsum", "Zcount", and "Zbase"

FIG. 10 depicts an exemplary array 1001 that may be used for discussion purposes to explain the computation of matrices "Zsum," "Zcount," and "Zbase." This array 1001 shows a hypothetical upsampling by a factor of four (e.g. variable "upsampleamount" equals 4) from subimages having a resolution of 3 by 3 pixels. In this example, the "upsampleamount" value and subimage size are different from those used in the above exemplary algorithm, but are suitable for illustrative purposes in FIG. 10. The letters V, W, X, Y, and Z denote five different subimages as they might be deposited into the array 1001. Array 1001 represents a subset of the entire size of arrays "Zsum," "Zcount," and "Zbase." Let subimage V be the reference image. Take note of location 1011 of subimage V's upper left pixel (e.g. row 1 column 1 of subimage V), which is deposited into location 1011 (row 3, column 2) of array 1001. The location in the array 1001 into which row 1 column 1 of subimage V is deposited may be arbitrarily chosen because subimage V is the reference subimage. Also take note of row 1 column 2 of subimage V, which is deposited into location 1013 (row 3 column 6) of array 1001, as well as the other locations into which pixels of subimage V are deposited. Adjacent pixels of each subimage are desposited into locations of the array 1001 four apart, which corresponds to the value of "upsampleamount" in this example. Wherever a pixel from subimage V is deposited in the array 1001, the corresponding element of "Zsum" is increased by the respective pixel value and the corresponding element of "Zcount" is incremented by one. The other subimages are deposited into array 1001 in the same manner, but shifted according to their displacement with respect to the reference subimage V. Suppose the measured displacement of subimage W with respect to subimage V, as stored in "ofm" and "ofn," is one quarter pixel right and one quarter pixel up. Since the upsampling factor in FIG. 10 is four, the result is that subimage W is deposited into array 1001 displaced one pixel right and one pixel up with respect to where subimage V is deposited. The corresponding elements of "Zsum" and "Zcount" are likewise respectfully increased and incremented as appropriate. The other subimages X, Y, and Z may be deposited into the array 1001 in the same manner.

In this example, some elements of the array 1001 may have been values corresponding to pixels from two or more subimages, for example location 1031. The value of "Zbase" at these locations will be the average of the two pixel values. Other locations may have one pixel value, for example location 1011. The value of "Zbase" at these locations will equal the pixel value. Yet other locations, for example location 1035, may not have any pixel value. The value of "Zbase" at these locations will equal zero, to denote that these locations are unfilled.

Part G of the exemplary algorithm implements step 961 and computes a filled version of "Zbase" and stores the result in matrix "Z." The purpose of this step is to estimate all values of "Zbase" that were not filled in above and hence are still equal to zero, using a value computed based on nearby known pixels. Many different algorithms may be used for this step. One possible method is to use a linear or other interpolation of neighboring known pixels. Another possible method is to use a simulated resistive grid, in which virtual resistors connect adjacent pixels and the filled pixels are set to a potential corresponding to the computed intensity. The resistive grid may then be simulated to compute potentials at other pixels. The resulting potentials at the other pixels would be the corresponding pixel values.

Instead of these two methods just described, the exemplary algorithm listed above implements a growing algorithm, where at each iteration unknown pixels adjacent to a known pixel are set to a weighted average of all adjacent known pixels. The domain of known pixels grows by one pixel per iteration until the array is filled. One may apply an optional smoothing step to smooth ridges between "plateaus" that may result. At this point, the matrix "Z" may be used as the resulting high resolution image and delivered by the processor 611 as the output 617.

Part H of the algorithm implements the optional step 963 of performing an image restoration step to further improve the sharpness of the image. In the exemplary algorithm listed, Part H is implemented using the Lucy-Richardson algorithm. In this case, the resulting matrix "Q" would form the output 617.

The exemplary algorithm may be modified depending on the specific implementation, including the number of openings, the pixel pitch of the image sensor, and the number of subimages generated by the opaque mask. Parameters may need to be changed accordingly, including but not limited to variables and matrices "bases," "upsampleamount," "G," "growits," "kssize," and "psfestimate." Generally, increasing the number of subimages may allow a higher upsamplingamount (e.g. variable "upsampleamount") to be practical.

A process or algorithm for reconstructing a high resolution image from the raw image obtained by the image sensor 609 may be realized using other implementations known in the art. For example, other superresolution algorithms and resolution enhancement algorithms may be used such as those described or referenced in U.S. Pat. No. 7,248,751.

The inversion method introduced in U.S. Pat. No. 7,009,652 and presented above in Equation (2) may also be used.

As a simplistically novel alternative to reconstructing a high resolution image, an image may be rendered by averaging the subimages together. The resolution will not be enhanced, but each pixel of the resulting image will be a mean of the corresponding pixels from the subimages. As a result, the average subimage may have less noise than any of the individual subimages. This may be performed using the MATLAB® code segment below, which can replace Parts C through H of the above exemplary algorithm, and with "Ymean" being the resulting output image.

```
% ====================================================
% Script to compute simple averages of subimages in "Y"
%
Ymean = Y(:,:,1);
for f = 2:yf
    Ymean = Ymean + Y(:,:,f);
end
Ymean = Ymean / yf;
% ====================================================
```

While the above MATLAB script computes an average of the subimages computationally, as a variation, it is also possible to compute the average electronically, by electrically connecting the corresponding pixel circuits. Although this may require more complicated electronic circuitry in the image sensor 609, this method has the advantage that the electrically connected pixel circuits may share the same readout circuit, which may reduce noise due to the need for only one analog to digital conversion per pixel. The reduced number of analog to digital conversions may allow an increased frame rate or the use of a slower analog to digital converter device. Such a configuration may also distribute the parasitic capacitance load of any readout amplifier circuits across multiple pixel circuits and hence improve operation in low light.

Figure 11:
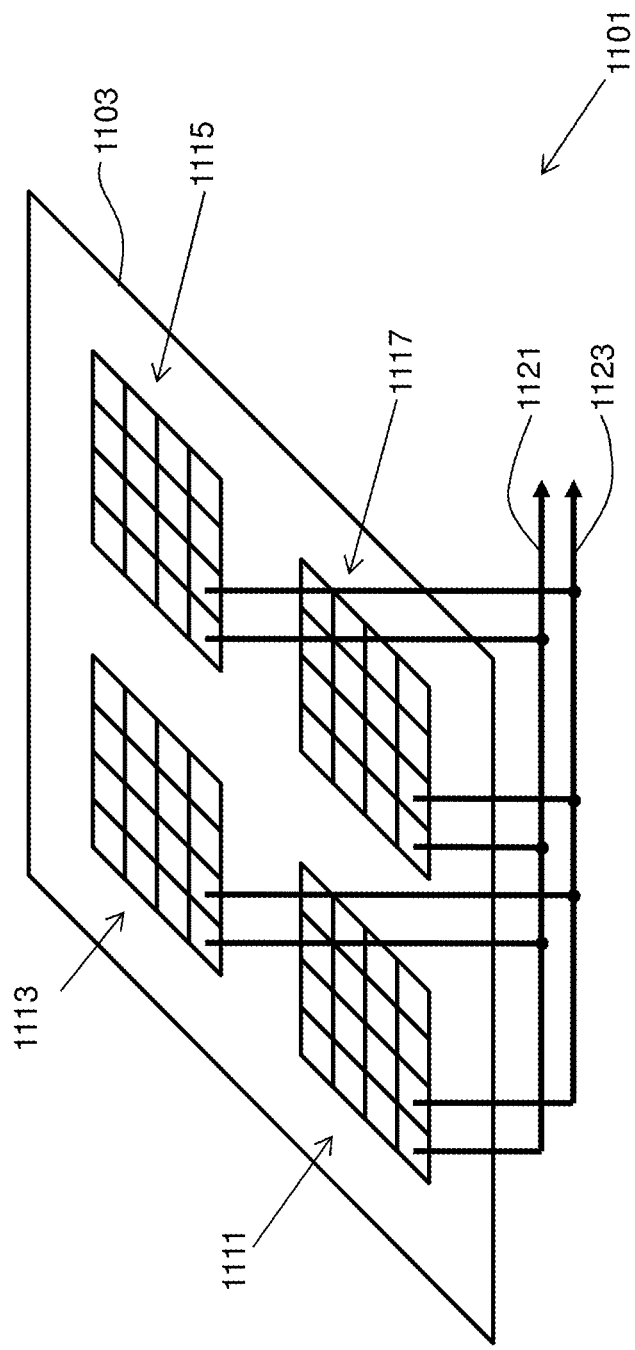
FIG. 11 depicts an exemplary array of electrically connected subpixel circuits.

As an example, FIG. 11 depicts an exemplary array of electrically connected subpixel circuits 1101. This figure shows a focal plane 1103, which may be the surface of an imaging chip, with circuits for four subimages (1111, 1113, 1115, and 1117). In this exemplary embodiment, each subimage is measured by a 4 by 4 array of light sensing circuits. The number of subimages and the resolution of each subimage may be varied from these numbers, which are presented for illustrative purposes only. The focal plane 1103 would be also associated with an optical structure having an opaque mask (not shown) having one opening for each subimage. Also shown are two signals 1121 and 1123. Signal 1121 connects to the bottom left pixel of each subimage circuit and thus may represent the average of these pixels. Signal 1121 may then be amplified or otherwise conditioned and then digitized. Signal 1123 likewise connects to the bottom row, second from the left pixel of each subimage. Fourteen other signals may likewise be defined, but are not shown in the figure for clarity. Each of these sixteen signals (e.g. 1121 and 1123 and the fourteen others) may then be amplified or otherwise conditioned and then digitized. Each of these signals will thus be generated from four times as much light as an individual pixel from just one subimage. The configuration depicted in FIG. 11 therefore allows more light to be collected per pixel while preserving the thickness of the optical structure.

Figure 12:
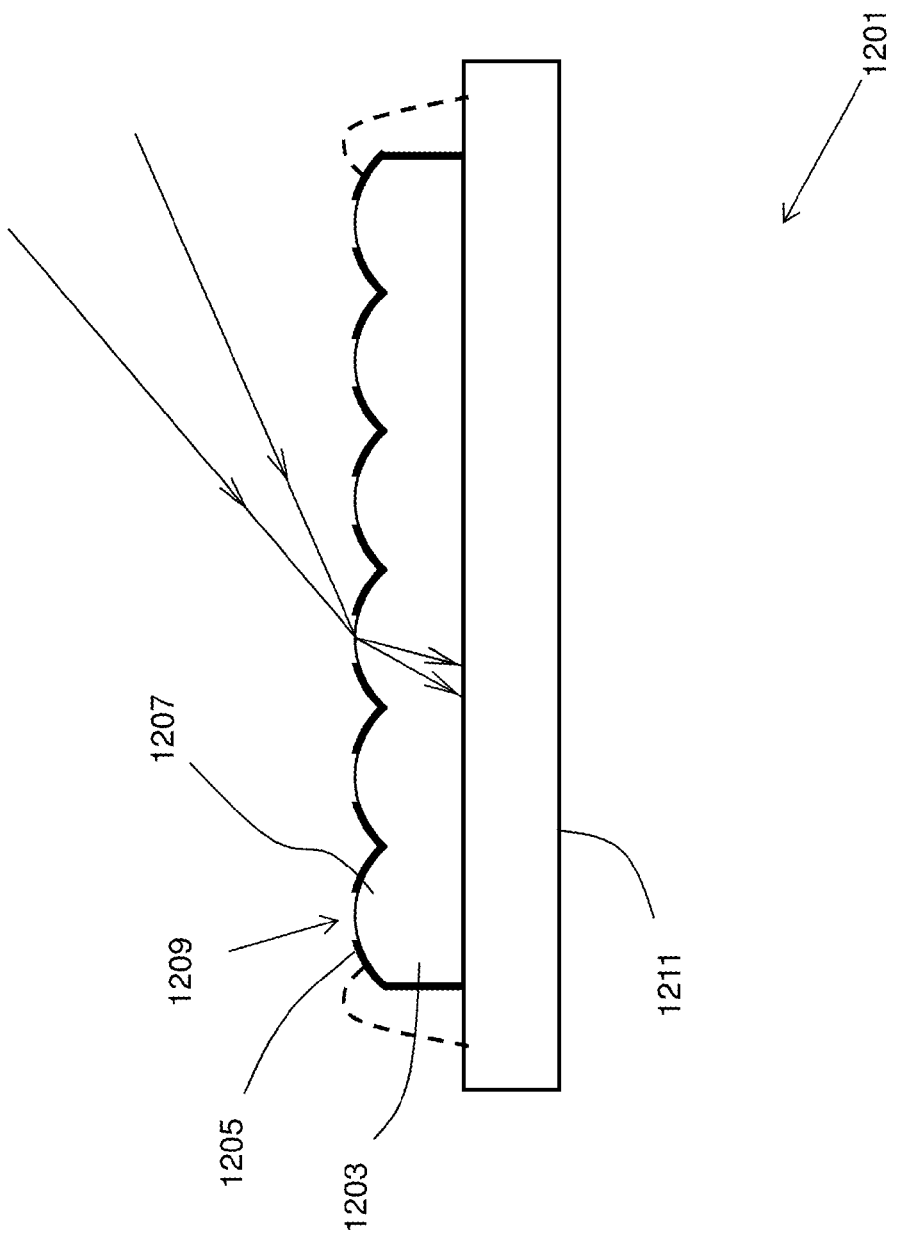
FIG. 12 depicts a cross section of an exemplary low profile camera with a lens bump array.

A number of variations may be made to the exemplary low profile camera 601 depicted in FIG. 6A. FIG. 12 depicts a cross section of an exemplary camera as before but with a lens bump array 1201. Similar to the exemplary camera 601, the exemplary low profile camera 1201 comprises transparent material 1203, an opaque mask 1205, and an image sensor 1211. A processor, not shown, acquires a raw image from the image sensor 1211, reconstructs a high resolution image, and provides the high resolution image as an output. The foregoing components are substantially the same as described above. However, the transparent material 1203 is substantially the same as transparent material 607 of FIG. 6A, except that the side of transparent material 1203 facing the visual field is patterned to have an array of convex surfaces each forming a lens bump or microlens. Each opening in the opaque mask 1205 is positioned relative to the apex of a corresponding lens bump. For example, lens bump 1207 is associated with opening 1209.

The term "lens bump" is used to describe a convex lens that is embedded within a larger piece of transparent material 1203. A "lens bump" may be formed by shaping that portion of the transparent material 1203 to have optical properties comparable to that of a convex lens. Alternatively, such lens bumps may be formed by embedding into or onto the transparent material 1203 small regions of secondary transparent material (not shown) having an even higher index of refraction than the transparent material 1203 that achieves the same effect. An array of such lens bumps may thus be patterned into the transparent material 1203. Alternatively, a lens bump array may be formed by disposing an array of lenses onto the image sensor 1211 in a manner that each lens may project a subimage onto the image sensor 1211. The term "lens element" may be used to refer to individual lens bumps or to individual lenses.

Camera 1201 may be operated similarly to that of the camera 601 of FIG. 6A, including using an algorithm similar to the novel algorithm listed above and shown in FIGS. 9A and 9B. Camera 1201 of FIG. 12 has several advantages. Each lens bump allows additional light to be collected, resulting in a brighter image on the image sensor. As is the case with the exemplary camera 601 of FIG. 6A, the spacing between openings may be balanced with the thickness of the transparent material 1203 and its refractive index to ensure that subimages from adjacent openings do not overlap. The distances between the openings in the opaque mask 1205, the size of the openings, and the thickness of the transparent material 1203 may vary with the specific implementation.

Figure 13:
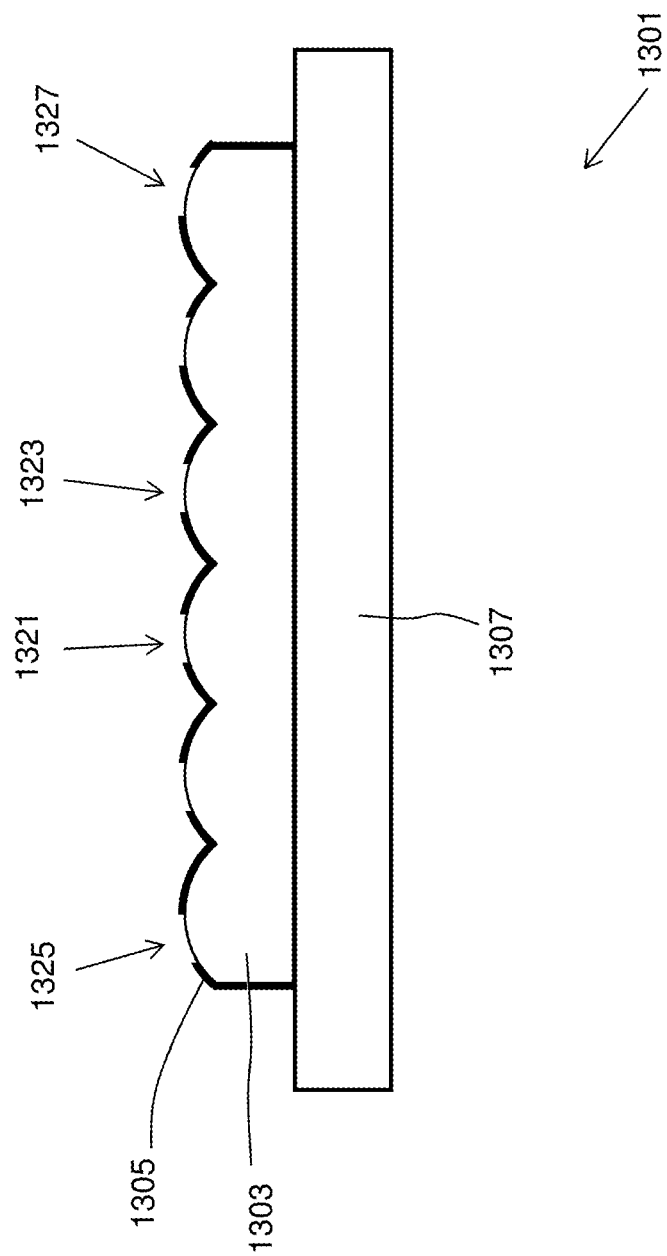
FIG. 13 depicts the cross section of an exemplary low profile camera with lens bumps and off-center openings.

In order to widen the field of view observable by the exemplary camera 1201 of FIG. 12, the locations of the openings in the opaque mask 1205 may be displaced laterally relative to the apex for each individual lens bump. FIG. 13 depicts the cross section of an exemplary low profile camera with a lens bump array and off-center openings 1301. Like the exemplary camera 1201, exemplary camera 1301 comprises transparent material 1303 with lens, an opaque mask 1305 with openings on the lens bumps, an image sensor 1307, and a processor (not shown). In this example, opening 1321 and opening 1323 are substantially centered relative to the apex of the corresponding lens bump on which each opening is formed, while opening 1325 and opening 1327 are off center to widen the total field of view. This arrangement may be configured to allow a full hemisphere field of view to be acquired.

The exemplary camera 1301 will require a modification to the above novel algorithm due to the fact that the individual subimages will sense slightly different portions of the visual field. Opening 1325, for example, may be used to image a portion of the field of view that is left of center. These changes may incorporate techniques including mosaicing algorithms used to stitch overlapping images into a single wide field of view image. The displacement between subimages will be substantially larger than one pixel and may need to be measured for example by using a calibration pattern and prior to the execution of algorithms 901 and 951. The depositing of subimages into the high resolution grid (e.g. 1001 and as performed in Part E) would need to account for these larger displacements between subimages. Image stitching and image mosaicing algorithms are a well known art. Sample algorithms may be found in the book "Image Alignment and Stitching: A Tutorial" by Richard Szeliski, ISBN 1-933019-04-2, originally published in Foundations and Trends in Computer Graphics and Vision Vol. 2 Issue 1 (2006).

Figure 14A:
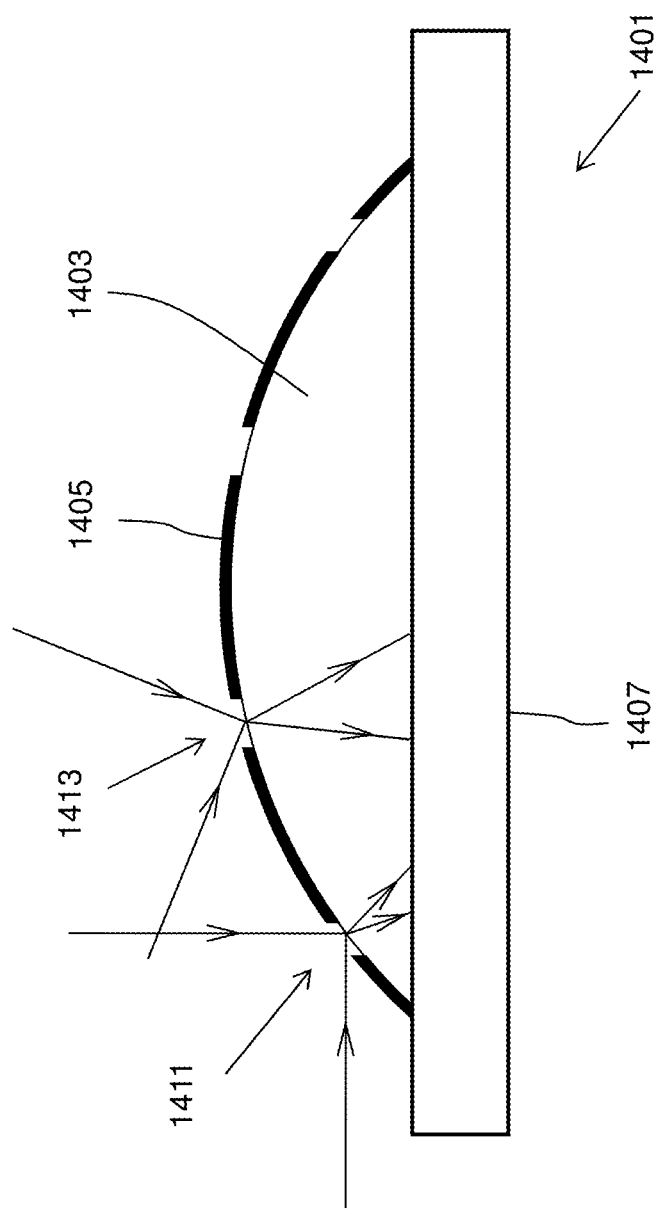
FIG. 14A depicts the cross section of an exemplary low profile camera with a single lens element and multiple openings in the opaque mask.

Another variation to the above teachings is to use a single lens for the entire side of transparent material. FIG. 14A depicts the cross section of an exemplary low profile camera 1401 with a single lens and multiple openings in the opaque mask. This is another variation of the exemplary camera 601 shown in FIG. 6A. The exemplary camera 1401 comprises a lens 1403, an opaque mask 1405 on the lens 1403, and an image sensor 1407. In the exemplary embodiment, the lens 1403 is transparent material shaped in the form of a lens or a similar shape, which is then be placed on the image sensor 1407. The lens 1403 may be formed from a plano convex (PCX) lens of glass or plastic or other transparent material. An opaque mask 1405 is placed onto the surface of the lens 1403 as shown in FIG. 14A. The opaque mask 1405 has several openings. Each opening may be used to image a different part of the visual field. For example, opening 1411 may be used to obtain an image from the leftward direction, while opening 1413 may be used to image a more forward portion of the visual field. The resulting subimages may be stitched together using a variation of the above exemplary algorithm or using one of many image mosaicing algorithms capable of generating a wide field of view image from a plurality of overlapping images.

Shapes other than curves may be used for the lens. For example, the lens may be multifaceted or polyhedral, where the boundary of the lens 1403 is flat at each opening, but oriented at a different angle to image a slightly different portion of the visual field. FIGS. 14B and 14C depict cross sections of alternative lens structures. FIG. 14B illustrates camera 1451 where the transparent material 1453 and an opaque mask 1455 have a cross section in the shape of a triangle. The cross section shows two openings associated with the two flat facets covered by the opaque mask 1455. Camera 1471 of FIG. 14C is similar except that the cross section of the transparent material 1473 and the opaque mask 1475 is trapezoidal shaped, and there are three openings in the cross section of opaque mask 1475. In a three dimensional view, the transparent material 1453 and 1473 may be respectively shaped like a pyramid and a truncated pyramid.

It is also possible to widen the field of view of exemplary multiple opening low profile camera 601 using the same technique as shown in FIG. 5D. A lens may be placed directly on top of the opaque mask 605. Different openings in the opaque mask 605 will then image slightly different portions of the field of view. All of the subimages may then be stitched together to reconstruct a single image with a wider field of view.

Figure 15:
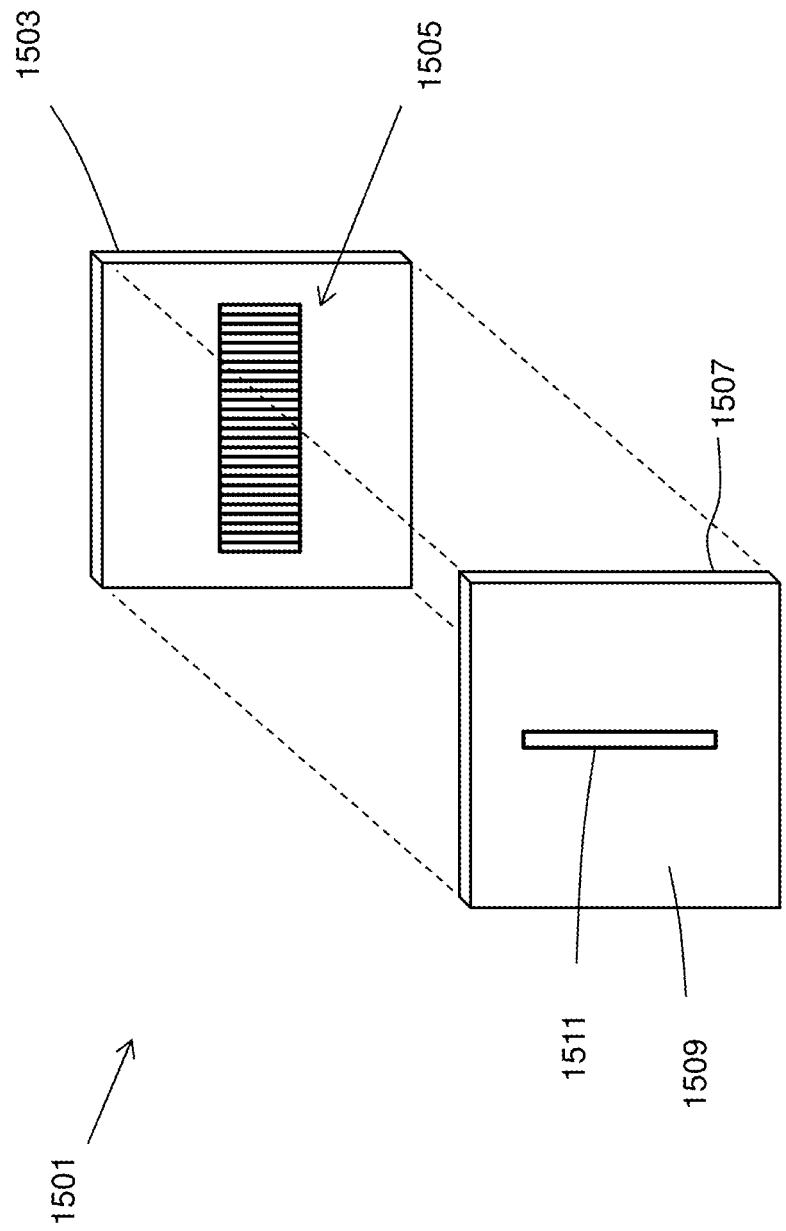
FIG. 15 depicts an exploded view of an exemplary low profile linear camera.

FIG. 15 depicts an exploded view of an exemplary low profile linear camera 1501. Camera 1501 combines the benefits of the camera 501 of FIG. 5A above with that of U.S. Pat. No. 6,194,695 entitled "Photoreceptor array for linear optical flow measurement" and incorporated herein by reference in its entirety. The camera 1501 comprises an image sensor 1503 having a linear pixel array 1505, transparent material 1507, and an opaque mask 1509, much like the exemplary cameras described above. The camera 1501 may also include a processor (not shown) to operate the image sensor 1503 and acquire image data from the linear pixel array 1505. In the exemplary camera 1501, the opaque mask 1509 has a rectangular shaped opening 1511. In the exemplary camera 1501, transparent material 1507 may be flush against the image sensor 1503 and produce a cross section view similar to that shown in FIG. 5A above. In FIG. 15, the opening 1511 is rectangular so as to blur the acquired image in the vertical direction but preserve information in the horizontal direction. The rectangular opening 1511 may optionally extend vertically all the way to the top and the bottom of the opaque mask 1509, since due to Snell's law light reaching one pixel circuit will have traveled through only the section of the opening within critical angle $\theta_c$.

The linear pixel array 1505 may comprise an array of rectangular pixel circuits as shown, or may comprise a linear array of point shaped pixel circuits, as discussed in U.S. Pat. No. 6,194,695. The camera 1501 of FIG. 15 is capable of acquiring substantially one dimensional images, such as those that may be used to measure visual motion or optical flow along one axis. One dimensional optical flow may then be computed using a substantially slower processor than is possible computing two dimensional optical flow on a two dimensional pixel array. This is due to the fact that one dimensional optical flow algorithms often require fewer arithmetic operations per pixel than two dimensional algorithms, and due to the fact that there are fewer pixels to be processed. The processor may include such an optical flow algorithm to generate a linear optical flow measurement based on the image acquired by the linear pixel array 1505.

Camera 1501 has the substantial advantage that both the opening 1511 and the light sensing circuits in the pixel array 1505 may be larger than their corresponding parts in FIG. 5A. This configuration allows each pixel circuit to acquire more light. The linear camera 1501 is therefore potentially more useful in lower light environments. For example, suppose the opening 1511 is rectangular shaped with the dimensions of 10 microns wide by 100 microns long. Suppose also that the shape of a pixel circuit in the pixel array 1505 is also 10 microns wide by 100 microns long. Such a rectangular pixel placed underneath such a rectangular opening will receive one hundred times as much light as a camera of the type shown in FIG. 5A having a 10 micron by 10 micron opening and a 10 micron by 10 micron individual pixel circuit.

Figure 16:
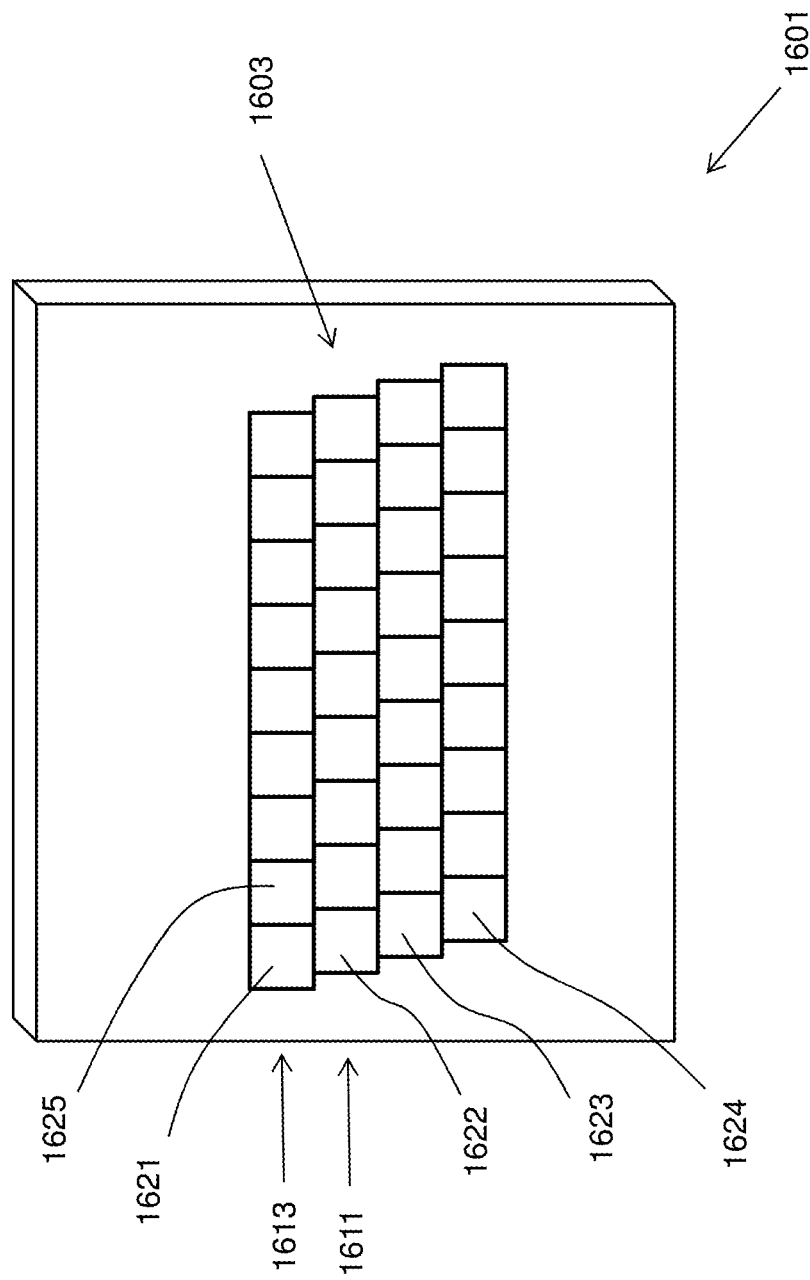
FIG. 16 depicts an exemplary image sensor with shifted pixel rows.

In order to increase the number of pixels in the horizontal direction, alternative pixel layouts may be used. FIG. 16 depicts an exemplary image sensor with shifted pixel rows 1601. This image sensor 1601 may be used in place of the image sensor 1503 of FIG. 15. The pixel array 1603 is similar to a conventional two dimensional pixel array, except that one row of pixels may be shifted horizontally with respect to another row. In FIG. 16, pixel row 1611 is shifted a quarter of a pixel to the right of pixel row 1613. The four rows of pixels shown may be used to achieve four times the pixel resolution as a single row. For example, the first five pixels of the resulting image may be formed respectively from pixels 1621, 1622, 1623, 1624, and 1625. The one dimensional image constructed as such from the pixel array 1603 may optionally be sharpened with an image restoration algorithm such as the Lucy-Richardson algorithm mentioned above.

Figure 17:
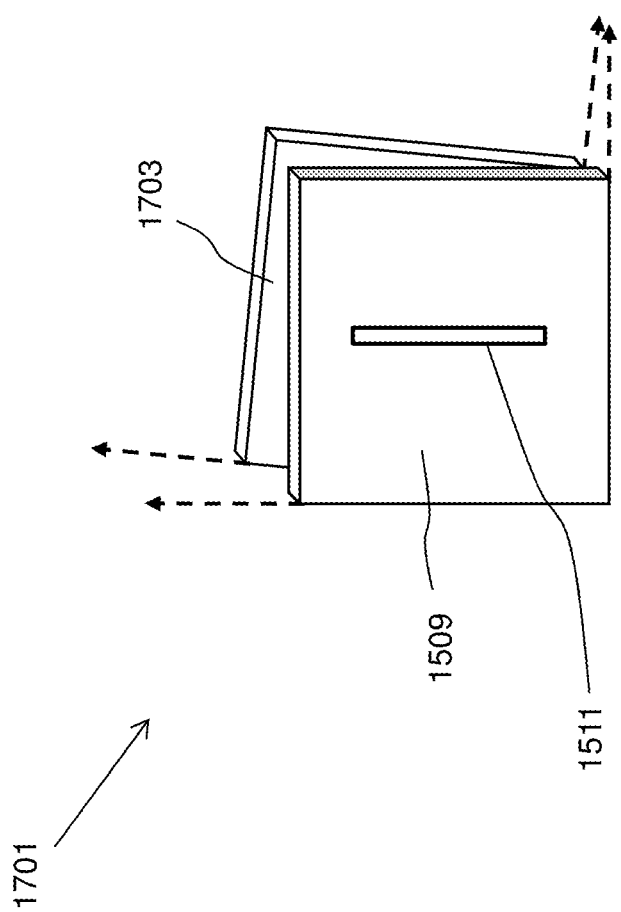
FIG. 17 illustrates the opaque mask of FIG. 15 and an image sensor rotated with respect to each other.

Alternatively, an effect similar to that of FIG. 16 may be obtained by using a standard two dimensional image sensor that has a standard square pixel geometry. FIG. 17 illustrates the opaque mask 1509 of FIG. 15 and an image sensor 1703 rotated with respect to one another. An effect of this rotation is that from the perspective of the opening 1511, one row of pixels will appear shifted with respect to an adjacent row. Note that this approach may also be applied to the exemplary camera 601 of FIG. 6A to implement spatial dithering in the locations of openings in the opaque mask 605.

Figure 18:
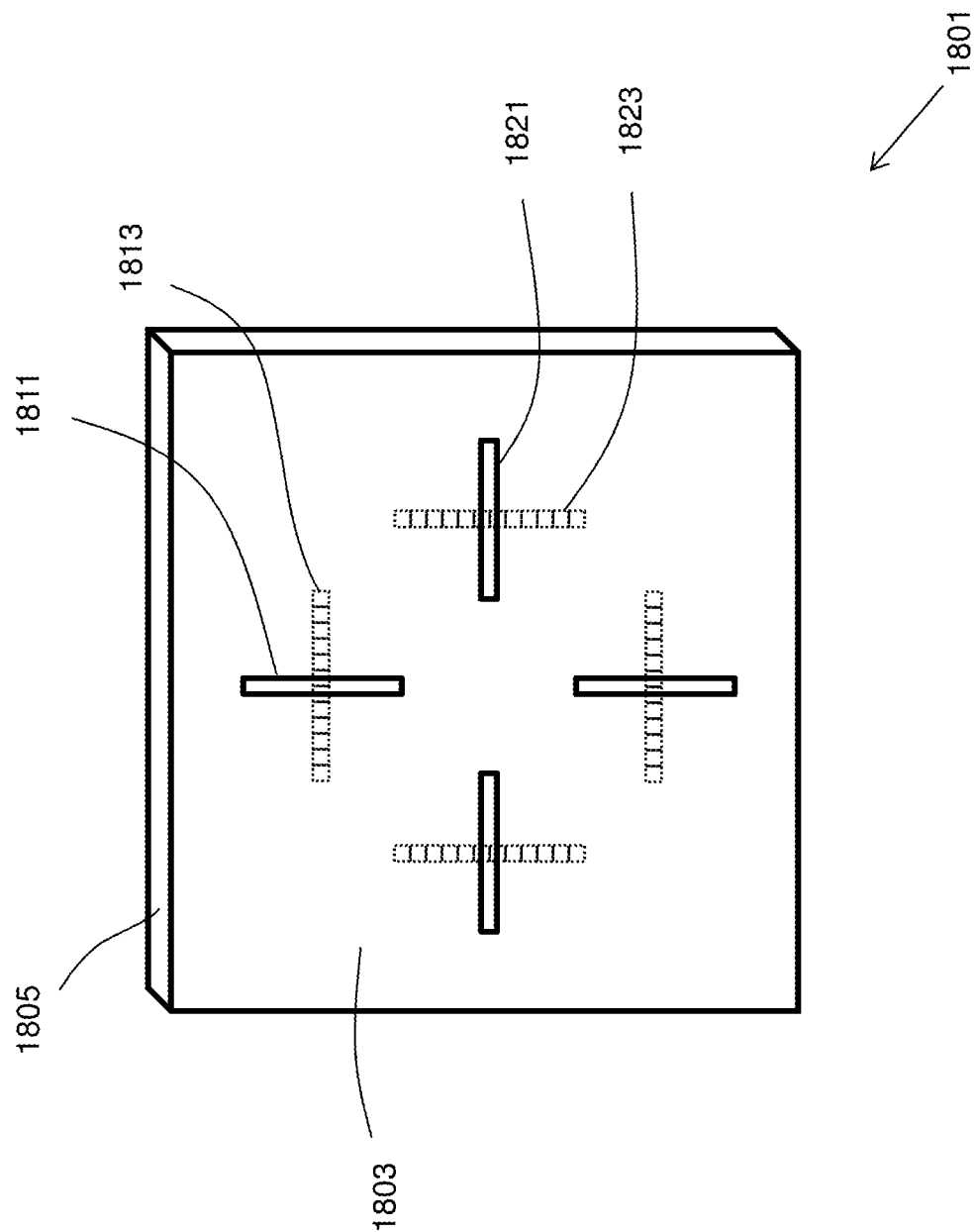
FIG. 18 illustrates an exemplary optical structure with both horizontal rectangular openings and vertical rectangular openings.

The concept of linear camera 1501 of FIG. 15 can be expanded. For example, FIG. 18 illustrates an exemplary optical structure 1801 with both horizontal rectangular openings and vertical rectangular openings. This optical structure contains an opaque mask 1803 on transparent material 1805, much like optical structures discussed above. However the opaque mask 1803 contains multiple openings oriented in different directions. This includes, for example, vertical opening 1811 and horizontal opening 1821 which are respectively placed above a horizontal array of pixels 1813 and a vertical array of pixels 1823. These openings may be similar to the opening 1511 of FIG. 15 in that they are rectangular shaped. If an image sensor is placed underneath the piece of transparent material 1805, arrays of pixels may be oriented underneath the openings to implement linear pixel arrays having the same function and capabilities as pixel array 1505 of FIG. 15. For example, underneath each vertical opening (for example opening 1811) could be an array of horizontal pixel circuits (for example the horizontal array of pixels 1813). These horizontal pixel circuits would output pixel values that could be used to sense the visual field in the horizontal direction, for example to compute optical flow in the horizontal direction. Likewise a vertical array of pixels (for example the vertical array of pixels 1823) could be placed underneath the horizontal opening (for example opening 1821) to sense visual information in the vertical direction including, for example, measuring optical flow in the vertical direction.

The exemplary optical structure 1801 of FIG. 18 may therefore allow two dimensional optical flow to be measured in components. The vertical opening 1811 may be used to compute the horizontal component of optical flow, while the horizontal opening 1821 may be used to compute the vertical component. These two components may then be combined to form a two dimensional optical flow measurement. Depending on the algorithm used, the number of arithmetic operations required to compute the one dimensional optical flow measurements may be substantially less than that required to compute a direct two dimensional optical flow measurement from a two dimensional grid of pixels. Processor memory requirements and analog to digital conversion (ADC) rates may be similarly reduced.

Alternatively, dedicated circuitry may be embedded on the image sensor to acquire the pixel values from the arrays of pixels and generate these optical flow measurements, or any other measurements that may be needed. Such measurements may then be output from the image sensor in analog or digital or whatever form is needed by an application. The combination of such an optical structure and an image sensor having these additional circuits would produce an extremely compact sensor.

A camera using the exemplary optical structure 1801 of FIG. 18 is essentially an array version of the exemplary camera 1501 of FIG. 15, except with some portions arranged to sense vertical information and other portions arranged to sense horizontal information. The image sensor may be constructed specifically for optical structure 1805, with configurations for pixel circuits and openings chosen together. Such an image sensor may have empty spaces between pixel arrays that may be filled with other circuits. Alternatively a standard two dimensional image sensor may be used, and only those pixels that are needed may be acquired and processed.

Figure 19:
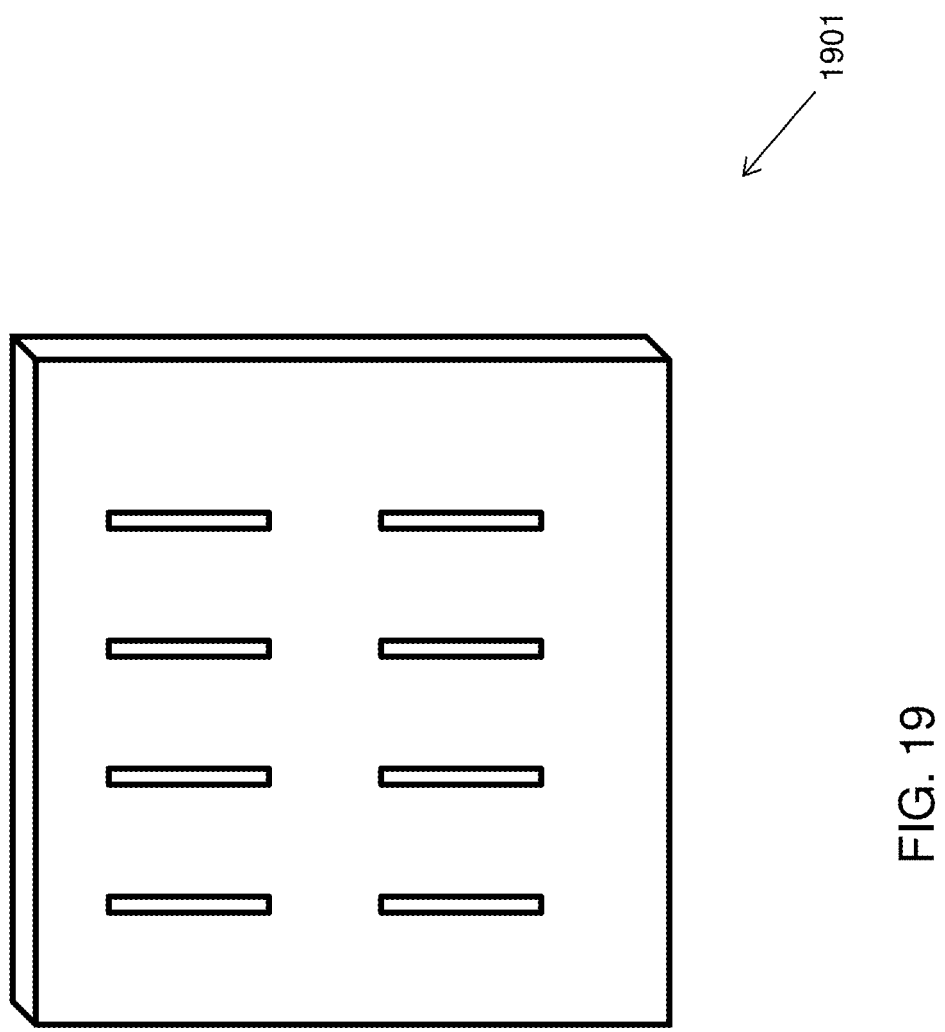
FIG. 19 depicts an exemplary optical structure having an array of rectangular openings in the opaque mask.

Another variation of the exemplary camera 1501 of FIG. 15 combines the benefits of the linear camera of FIG. 15 with the multiple opening opaque mask 605 depicted in FIG. 6A. FIG. 19 depicts an exemplary optical structure 1901 having an array of rectangular openings in the opaque mask. An image sensor with an array of pixel circuits (not shown) may be designed to be placed underneath the opaque mask 1901 to acquire a raw image. Spatial dither may be applied to the locations of rectangular openings in mask 1901 in a manner similar to that depicted above in FIG. 7B. A one dimensional version of the algorithms 901 and 951 shown in FIGS. 9A and 9B may then be used to reconstruct a high resolution linear image from the raw image.

Alternatively, the rectangular openings in exemplary optical structure 1901 may be located close together so that their respective subimages overlap. A single pixel located at the intersection of these subimages would receive light from all of the rectangular openings. Equivalently, the amount of light striking the pixel would be an inner product of the visual field and a receptive function corresponding to the multiple rectangles. Different pixels underneath the exemplary optical structure 1901 would sense the inner product between the visual field and a similar receptive function projected in a different direction.

A low profile linear flat camera may be realized using any other implementations known in the art and the description presented herein is for illustration purposes and does not limit the scope of the present teaching. For example, the openings in the opaque mask may be an elongated shape other than a rectangle. Sample elongated shapes include an ellipse that is substantially longer than it is wide, or a diamond or another polygon that is substantially longer than it is wide.

A variation of the above teachings is to use a multiple opening camera as a stereo ranging device to measure the distance to a nearby object. Consider the following example using the exemplary multiple opening camera 601 of FIG. 6A. Suppose that through either a calibration step or through repeated imaging of distant objects, the subimage displacements "ofm" and "ofn" become known and reliable. Suppose next the exemplary camera 601 images a nearby object. The measured subimage displacements "ofm" and "ofn" will change, and do so in a manner dependent on the distance between the exemplary camera 601 and the nearby object. Measurement of the resulting disparity between the original subimage displacements and the subimage displacements due to the nearby object may be used to measure the distance between the camera 601 and the nearby object. The measured distance would be a function of the thickness of the transparent material 607, the pitch between pixels on the image sensor 609, the distance between the openings on the opaque mask 605, and the difference between the "ofm" and "ofn" values obtained imaging a far away object and these values obtained when imaging a nearby object. Using the new measured subimage disparities, in some cases a high resolution image may be reconstructed using essentially the same algorithms 901 and 951 above. For example, suppose that s is the distance between two openings in the opaque mask 605, t is the thickness of the transparent material 607, p is the pitch between adjacent pixels on the image sensor 609, $n_1$ is the index of refraction of the surrounding environment, and $n_2$ is the index of refraction of the transparent material 607.

Suppose $ofm_1$ and $ofn_1$ are the disparities between the subimages associated with the two openings when viewing an infinitely far background. Suppose $ofm_2$ and $ofn_2$ are the disparities between the subimages associated with the same two openings measured when viewing a nearby object. Then the total change in disparity ΔOF in pixels is:

$$\Delta OF = \sqrt{(ofm_1 - ofm_2)^2 + (ofn_1 - ofn_2)^2}. \quad (6)$$

A first order approximation of the distance d to the nearby object may be obtained with:

$$d \approx \frac{stm_1}{(\Delta OF)pn_2}. \quad (7)$$

Equations (6) and (7) are written for pixel arrays arranged in a square grid and assume that ΔOF accounts for both whole and fractional changes in disparity, including when the object is close enough for the disparity to change by more than one pixel. When measuring the four disparities $ofm_1$, $ofn_1$, $ofm_2$, and $ofn_2$, it may be beneficial to use only the center of the field of view and/or only the region of the field of view occupied by the nearby object. This may minimize the effects of distortion and/or any pixel information not associated with the nearby object.

A related variation is to use a multiple opening camera as a miniature light field camera or a plenoptic camera. The subimage of each opening in the opaque mask would be a two dimensional image of the environment as seen from the perspective of the respective opening.

The above teachings may be used to fabricate inexpensive cameras for use in a variety of applications. As described above, the optical structure including the opaque mask may be fabricated inexpensively and in bulk using photoplotter printers, a mature existing technology. These optical assemblies may be printed in bulk, physically cut, and mounted onto image sensors. Using clear adhesive between the optical structure and the image sensor, or using adhesive at the edge of the optical structure, the optical structure may be mounted to the imager using standard manufacturing equipment or even by hand. Because in some embodiments the optical apparatus need not be precisely placed, this method is appropriate for use in manufacturing inexpensive camera sensors for mass consumer applications.

Figure 20:
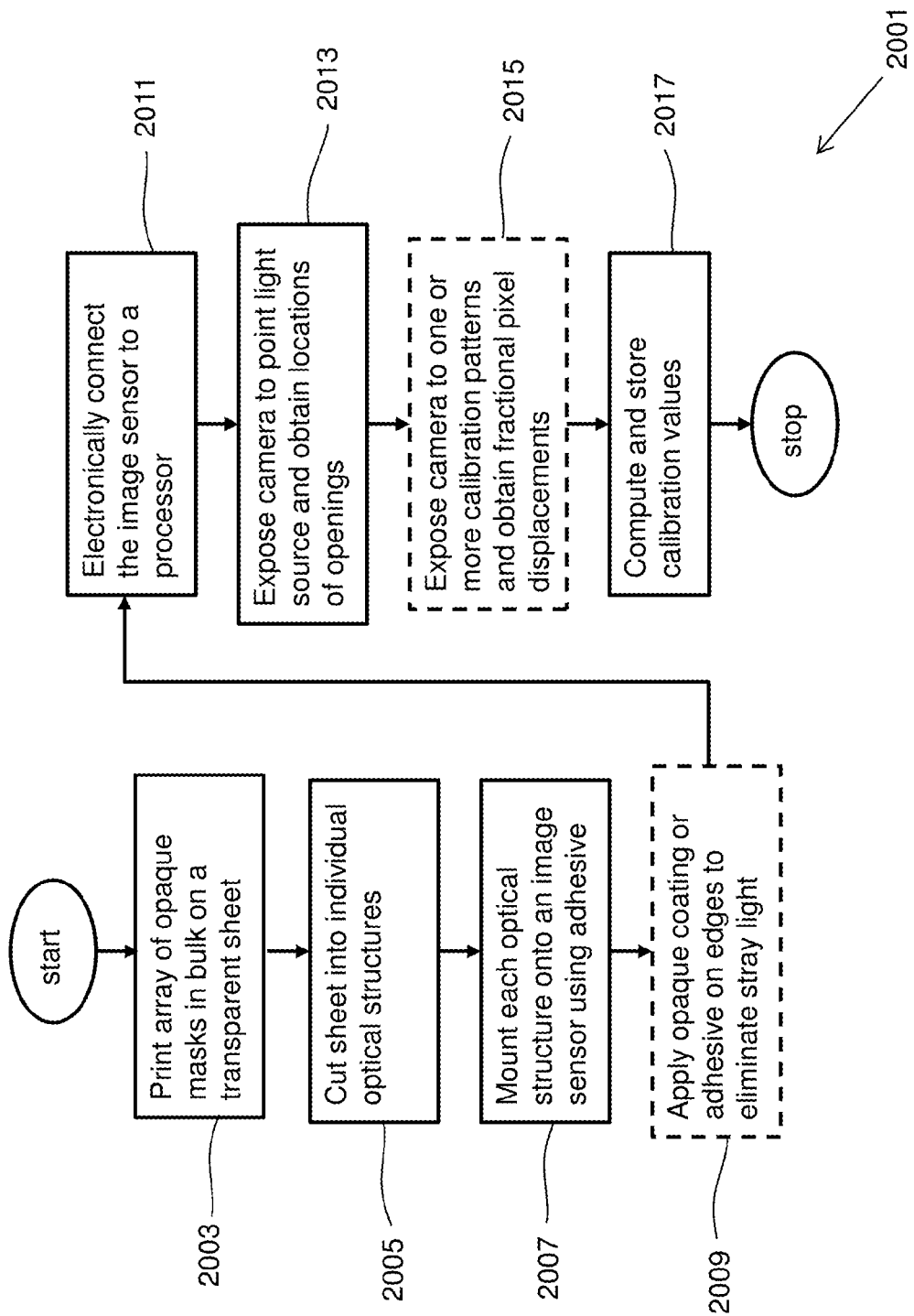
FIG. 20 depicts a method for manufacturing low profile cameras.

FIG. 20 depicts a method 2001 for manufacturing low profile cameras using the above teachings. This process assumes that a large number of image sensors has already been manufactured using well known and established techniques. The steps have already been described above; they will be described again below.

Figure 21A:
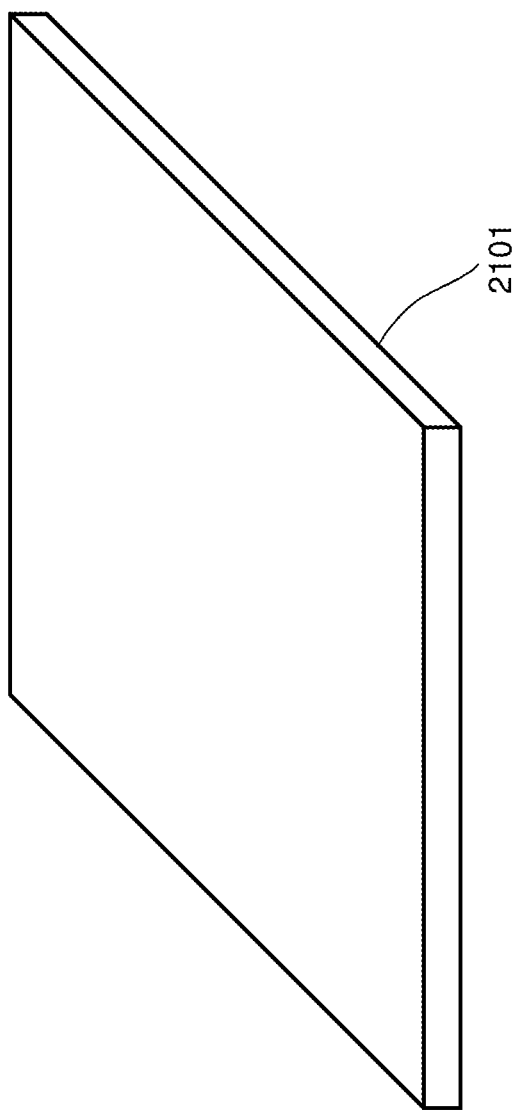
FIG. 21A shows a transparent sheet.
Figure 21B:
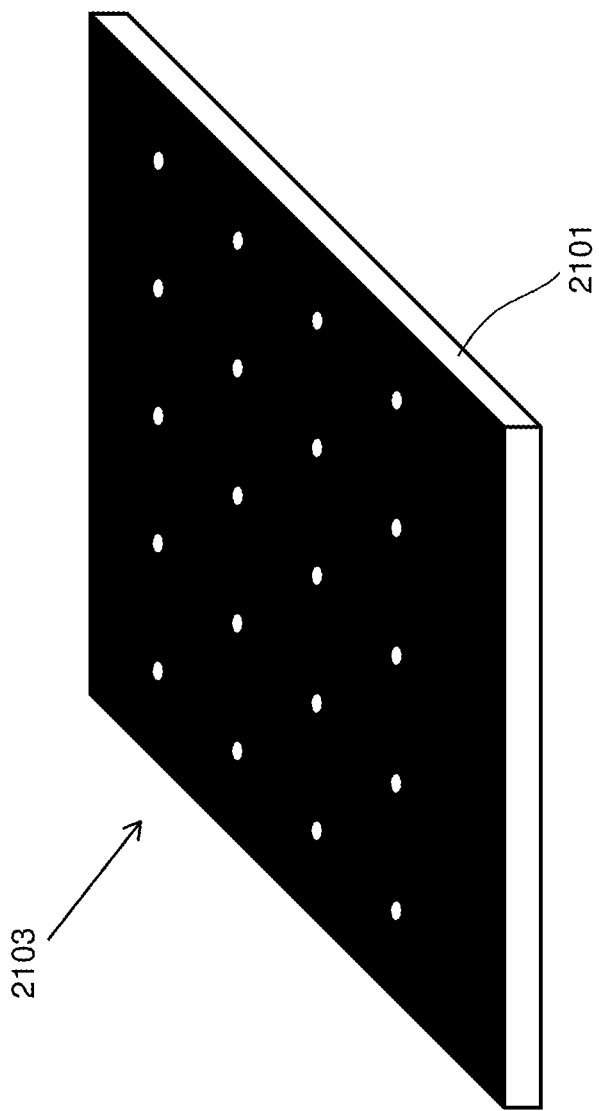
FIG. 21B shows an array of opaque masks printed onto the transparent sheet.

The first step 2003 is to print an array of opaque masks onto a transparent sheet. FIG. 21A shows a transparent sheet 2101. This sheet may be any transparent material, but the flexible nature of plastic makes it a suitable choice. FIG. 21B shows an array of opaque masks 2103 printed onto the transparent sheet 2101. In the example shown in FIG. 21B, each mask has a single opening and is suitable for making a camera such as the camera 501 of FIG. 5A. If method 2001 is being used to manufacture low profile cameras with multiple openings such as camera 601 of FIG. 6A, then each single opening of the array 2103 would be replaced with an array of openings in a manner depicted in FIG. 6B.

Figure 21C:
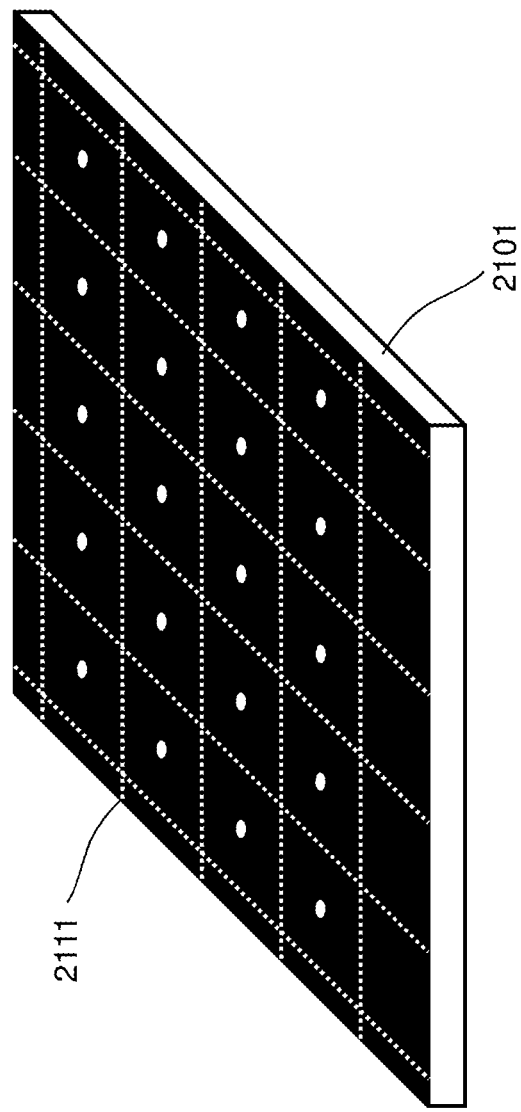
FIG. 21C shows a grid of scribe lines that may be used to guide where the sheet is cut.
Figure 21D:
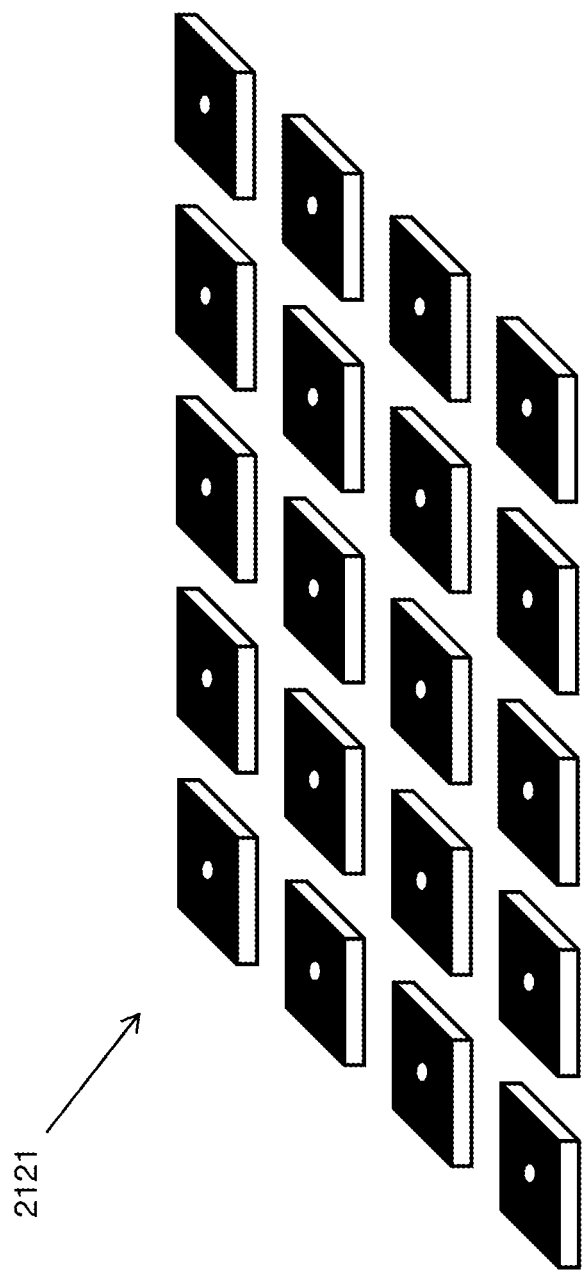
FIG. 21D shows the plurality of optical structures that results from cutting the sheet.

The second step 2005 is to cut up the sheet 2101 into individual optical structures. FIG. 21C shows a grid of scribe lines that may be used to guide where the sheet 2101 is cut. The scribe lines are shown as dotted white lines in the figure, for example scribe line 2111 that defines a cut between two rows of masks. FIG. 21D shows the plurality optical structures 2121 that results from cutting the sheet 2101, with each optical structure comprising transparent material and an opaque mask with an opening. Each of these optical structures is equivalent to optical structure 503 of FIG. 5A (or optical structure 603 of FIG. 6A, in the case where method 2001 is being used to manufacture low profile cameras with multiple openings). Portions of the sheet 2101 at the edges and not having any openings in the opaque mask are waste material and may be discarded.

Figure 21E:
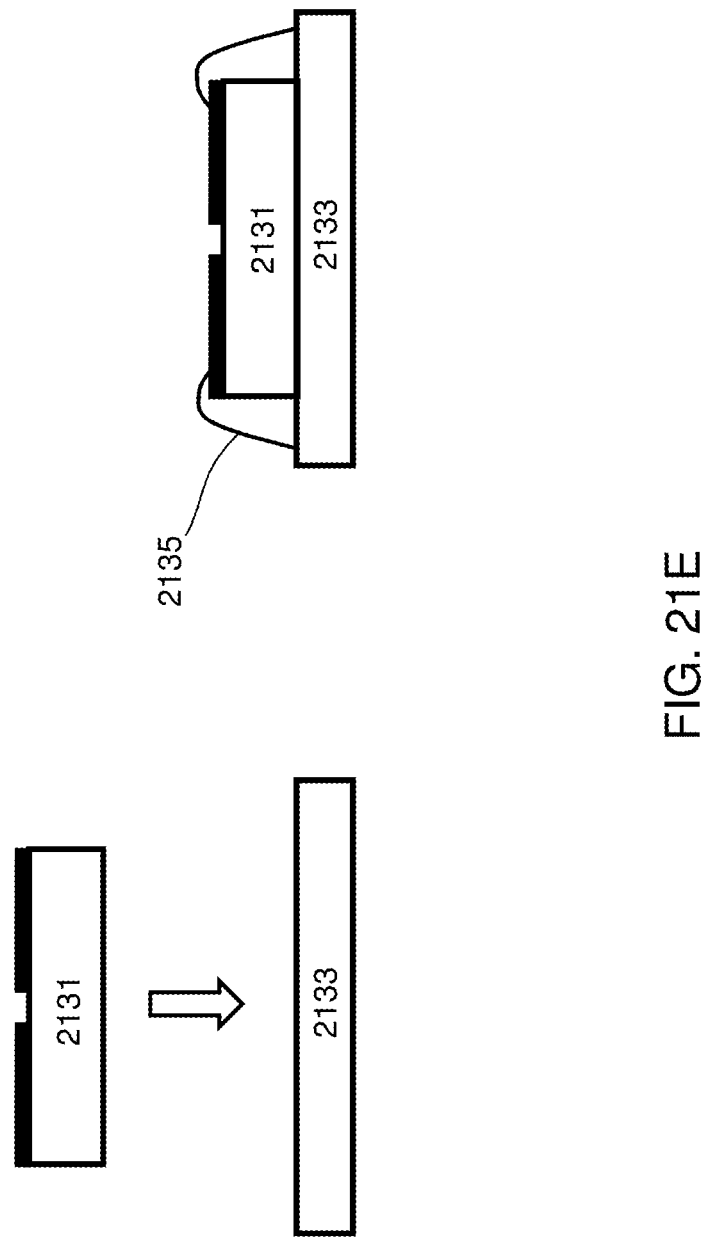
FIG. 21E shows an optical structure being mounted onto an image sensor using edge adhesive.

The third step 2007 is to mount each optical structure onto an image sensor using adhesive. Two possible methods of implementing step 2007 are discussed, one using edge adhesive and one using transparent adhesive between the two parts. FIG. 21E shows an optical structure 2131 being mounted onto an image sensor 2133 using edge adhesive. Optical structure 2131 may be taken from the plurality of optical structures 2121 and then placed directly on top of the image sensor 2133. Adhesive 2135 is then deposited at the edges of the optical structure 2131 to hold it to the image sensor 2133. As described above, it is beneficial for the adhesive 2135 to be opaque so that is prevents light from entering the optical structure 2131 from the side.

Figure 21F:
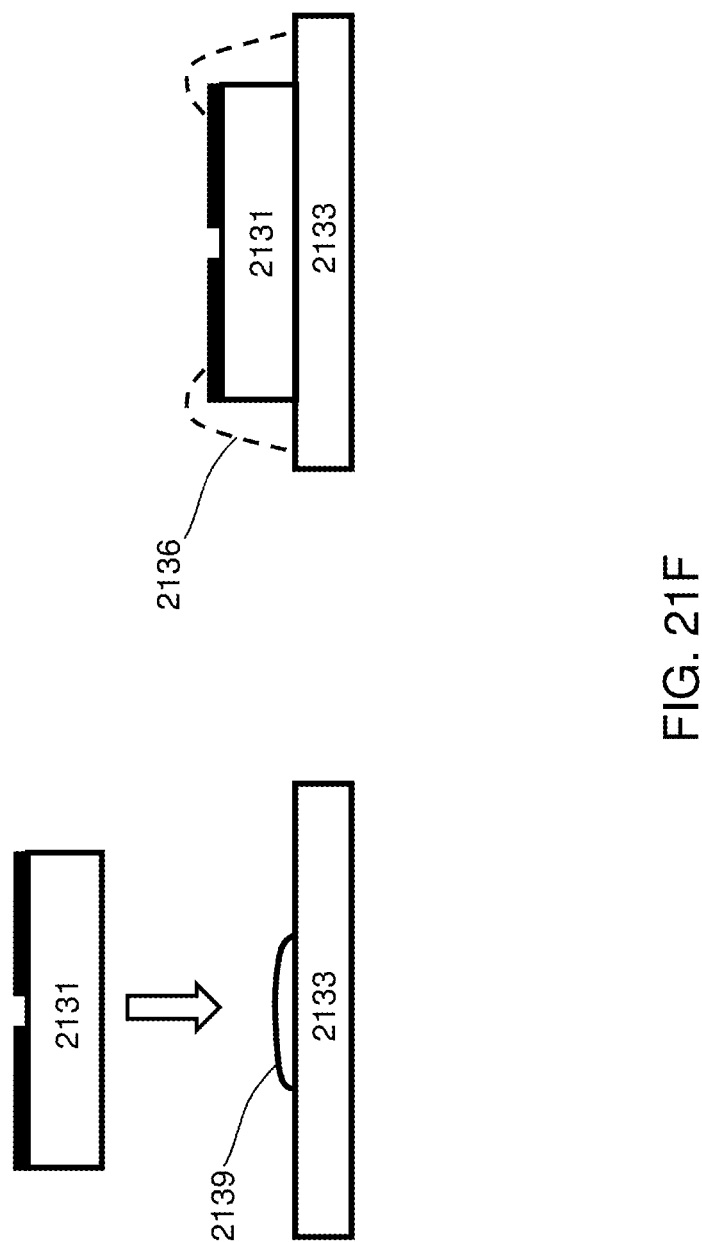
FIG. 21F shows the optical structure being mounted onto the image sensor using transparent adhesive.

Alternatively, FIG. 21F shows the optical structure 2131 being mounted onto the image sensor 2133 using transparent adhesive 2139. First a drop of transparent adhesive 2139 is deposited on the image sensor 2133. Next the optical structure 2131 is pressed down onto the image sensor 2133 with enough force to spread the adhesive across the entire contact surface. The adhesive is then cured or allowed to cure.

The fourth step 2009 is optional and depends on the application and the method of mounting the optical structure to the image sensor. If needed, opaque material may be applied to the edges of the transparent material to prevent light from entering the optical structure from the side, as depicted initially in FIG. 5A. This is also depicted as opaque material 2136 shown in FIG. 21F. Step 2009 is generally beneficial if the method of implementing previous step 2007 allows light to enter the optical structure from the side. However if the resulting camera will be further enclosed in an opaque housing (such as shown in FIG. 5F) that prevents such stray light from entering the optical structure from the side, step 2009 may be skipped.

Figure 21G:
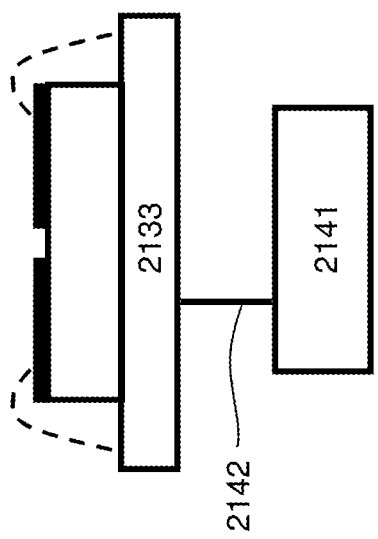
FIG. 21G shows the image sensor electrically connected to a processor via an electronic connection.

The fifth step 2011 is to electronically connect the image sensor to a processor. FIG. 21G shows the image sensor 2133 electrically connected to a processor 2141 via an electronic connection 2142. Depending on the specific implementation, the electronic connection 2142 may be formed from a combination of wire bonds, bump bonds, and/or conductive traces on a circuit board.

The sixth step 2013 is to expose the camera to a point light source to obtain the locations of openings in the opaque mask to whole pixel accuracy. This may be performed as described above with FIG. 8B. This step is beneficial if the opaque mask has multiple openings, such as in any variations of the exemplary multiple opening low profile camera 601 of FIG. 6A. An exception is if step 2007 is performed with enough precision to reliably place the openings in known locations. If the opaque mask has just one opening, for example to implement a variation of the camera 501 of FIG. 5A, then step 2013 is not required but may still be beneficial so that the location of the image formed through the opening is known accurately.

The seventh step 2015 is to expose the camera to one or more calibration patterns, and then use an optical flow algorithm (or similar algorithm) to measure subpixel displacements. This step may be performed as a manufacturing step. It may optionally be omitted if this step will be performed during program execution, such as described in Part D of the above exemplary algorithm.

The final step 2017 is to store all computed calibration values, including those of step 2013 and optional step 2015, into the processor's memory. These values may then be used later on during runtime. Other calibration values, for example fixed pattern noise masks, may be computed and stored as well at this time.

In some implementations, the image sensor and the processor may be mounted on a circuit board or similar substrate. In this case, it may be beneficial to mount these two components to the circuit board before the optical structure is mounted on the image sensor. In this case, step 2011 may be performed before step 2007 instead of before step 2013.

The above exemplary embodiments generally describe optical structures constructed from transparent material and an opaque mask that is then placed onto an imaging chip. Alternatively, one may instead print the opaque mask directly onto an image sensor. This variation may be applied if the image sensor or its light sensing circuitry is already enclosed or encapsulated within a transparent material. This variation would be an inexpensive additional step to existing processes to manufacture and package image sensors. For example, if the image sensors are packaged at the wafer level before cutting into individual image sensor devices, the additional step of printing the opaque mask on the wafer may be performed before the wafer is cut.

Note that a method for manufacturing low profile cameras may be realized using any other implementations known in the art and the description presented herein is for illustration purposes and does not limit the scope of the present teaching.

Figure 22:
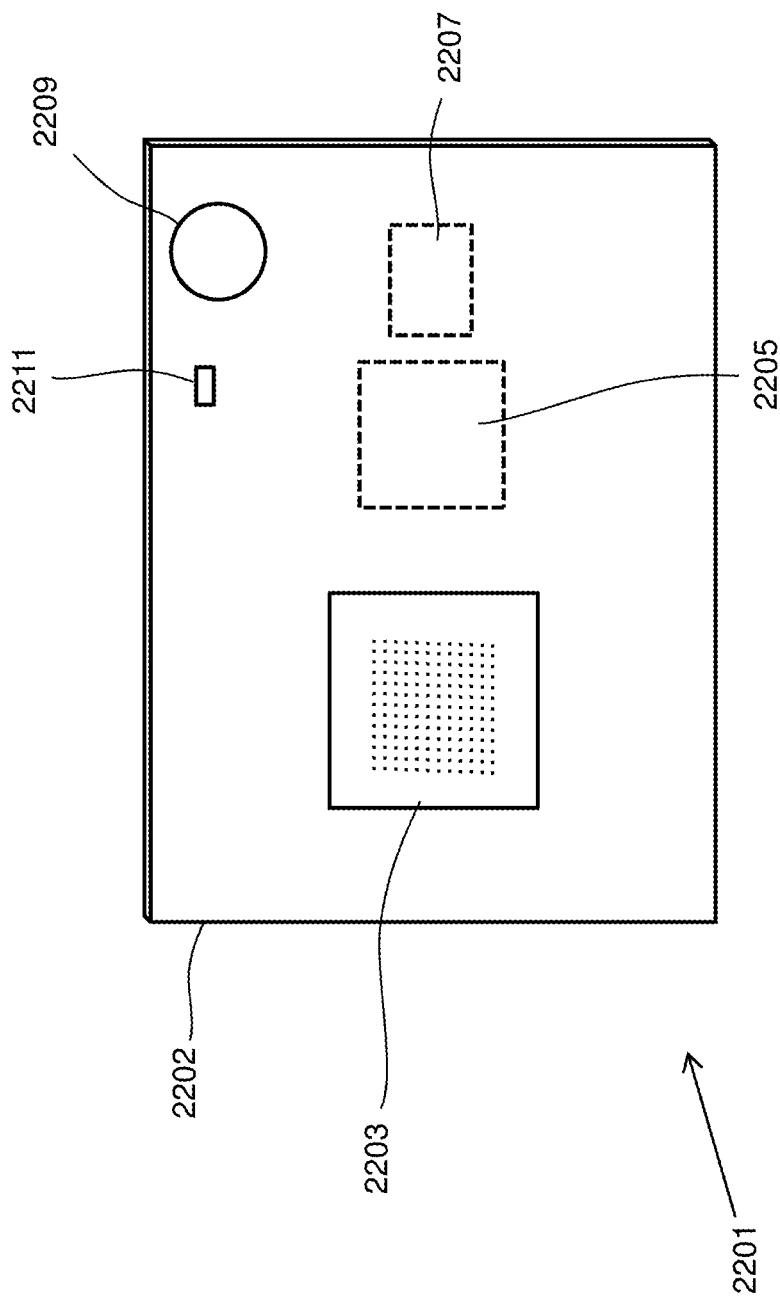
FIG. 22 shows a credit card sized digital camera.

The above teachings may be used to implement a digital camera for consumer use. FIG. 22 shows a credit card sized digital camera 2201 that may be implemented using the above teachings, in particular those associated with the exemplary multiple opening low profile camera 601 of FIG. 6A. Camera 2201 comprises a camera body 2202, an optical structure 2203 having an opaque mask having multiple openings, an image sensor (not shown) located directly underneath the optical structure 2203, a processor 2205, non-volatile memory 2207, a trigger button 2209, and an LED flash 2211. The processor 2205 and the non-volatile memory 2207 may be embedded inside the camera body 2202 and not visible from the outside. Trigger button 2209 and LED flash 2211 may be implemented substantially flush with the camera body 2202. When trigger button 2209 is pressed, LED flash 2211 may light up if necessary to provide light and then the image sensor underneath the optical structure 2203 may then acquire a raw image. The raw image would be formed from light passing through the opaque mask in the optical structure 2203 and may be similar to image 801 depicted in FIG. 8A. The processor 2205 would then extract subimages from the raw image and reconstruct a high resolution image from the subimages using any appropriate algorithm, for example algorithm 901 of FIG. 9A. The reconstructed image may then be stored on the non-volatile memory 2207 for later retrieval. Optionally the processor 2205 may just acquire the raw image taken by the image sensor and record it directly to the non-volatile memory 2207, and a high resolution image may be reconstructed at a later time with a separate personal computer (not shown). An optional liquid crystal or other display (not shown), located on the reverse side of camera 2201, may be used to help the user aim the camera and select when to press the trigger button 2209. Using the above teachings, it would be possible to implement the digital camera 2201 in a package similar in size to a credit card, for example 85 mm wide, 54 mm high, and less than a millimeter thick. The digital camera 2201 may be implemented in other form factors as well, for example in the size of a button to implement a spy camera.

The above exemplary cameras may be configured to sense and extract information from the environment in a real-time manner. For example, the cameras may acquire imagery, including one dimensional images, that may then be processed by optical flow algorithms or stereo algorithms or other algorithms. Such cameras may also be referred to as "visual sensors." The outputs of these algorithms may be used for a wide variety of applications, for example including but not limited to: providing inexpensive vision sensing to toys or consumer robots such as robotic vacuum cleaners, monitoring an area for moving people or vehicles, counting the number of people, vehicles, or other objects passing by a location, and so forth. The low profile of such cameras would make then suitable for various robotic platforms, and may, for example, provide peripheral visual sensing in addition to "primary sensing." Such peripheral sensors may be used, for example, to image the area underneath a ground robot or outside close to the ground. Such sensors may be placed in the hands, feet, or legs of moving or walking robots. The low mass afforded by such sensors makes them particularly useful for air vehicles, including so-called "micro" air vehicles and "nano" air vehicles, the latter similar in size to an insect. A camera manufactured using the above teachings may be fabricated such that the image sensor and the optics together weigh no more than several milligrams.

To achieve an omnidirectional field of view, several of the above cameras may be used together, with their respective images stitched together using image stitching and image mosaicing algorithms. For example, two of the exemplary cameras 1401 of FIG. 14A may be used to obtain an omnidirectional image, with one camera looking in each direction. Both image sensors and their corresponding lenses may be mounted on opposite sides of a circuit board. Four linear profile cameras (for example camera 501 of FIG. 5A or camera 601 of FIG. 6A) may be likewise used, if they are mounted so that their respective fields of view cover the whole sphere field of view. This may be obtained by mounting the cameras on a regular tetrahedron shape. Likewise six such cameras may be mounted on a cube. If more cameras are desired, multiple cameras may be mounted on a flexible circuit board, in a manner taught by U.S. Patent Application No. 2008/0225420 entitled "Multiple Aperture Optical System" and incorporated by reference in its entirety. For example, an EyeStrip (FIG. 11 reference 1001 of the aforementioned U.S. patent application) may comprise an array of image sensors mounted to a flexible circuit board, with an optical structure placed onto each image sensor, with the optical structure constructed from a piece of transparent material and an opaque mask using any of the above teachings. Once this EyeStrip is fabricated, it may be bent to form an omnidirectional camera.

Other variations to the above exemplary embodiments may be considered. For example, in the exemplary multiple opening camera 601 of FIG. 6A and in variations of this camera, it was taught that the subimages produced by individual openings in the opaque mask 605 do not overlap on the pixel array 613. This makes it easier to isolate one subimage from another. To obtain a more compact sensor, it is possible to consider variations wherein the subimages do overlap. However this may require additional processing to isolate the subimages from each other. As such, this is a variation that would be appropriate in implementations where adequate processing power is available. Such a variation may be more suitable for linear implementations, for example in the exemplary linear camera 1501 of FIG. 15, due to the fewer number of pixels involved.

Another variation that may be made to the exemplary multiple opening camera 601 is to reduce both the size of the openings in the opaque mask 605 and the fill factor of the pixel circuits in the pixel array 613. For example, suppose the pixel pitch in pixel array 613 is 20 microns. The openings in the opaque mask 605 may be reduced to a size such as 4 microns square, and the light sensitive area of each pixel circuit may be reduced to a similar size. This will cause each pixel circuit in pixel array 613 to have a narrower field of view, such that adjacent pixels in a subimage may not overlap. The filled image e.g. "Z" computed above in Part G of the above exemplary algorithm may as a result be sharper. However a flat camera implemented with this approach will be less sensitive to light due to the smaller openings and smaller light sensing circuits. Also the effects of diffraction of light through the openings may become more significant. Furthermore the fractional pixel displacements of variables "ofm" and "ofn" may need to be computed beforehand, in a calibration step, and using a texture pattern that facilitates the measurement of these values.

Another variation that may be made to the exemplary multiple opening camera 601 or to the exemplary low profile linear camera 1501 is for the different openings to have different sizes. In this case, the resulting subimages will have varying intensities, with larger openings producing brighter images. The collection of subimages may then be used to produce an output image having a higher dynamic range than what is directly possible with the image sensor using a single opening size. The subimages produced from large openings may be used to image dim areas of the visual field while the subimages from small openings may be used to image bright areas of the visual field.

While the inventions have been described with reference to the certain illustrated embodiments, the words that have been used herein are words of description, rather than words of limitation. Changes may be made, within the purview of the appended claims, without departing from the scope and spirit of the invention in its aspects. Although the inventions have been described herein with reference to particular structures, acts, and materials, the invention is not to be limited to the particulars disclosed, but rather can be embodied in a wide variety of forms, some of which may be quite different from those of the disclosed embodiments, and extends to all equivalent structures, acts, and, materials, such as are within the scope of the appended claims.

What is claimed is:

1. A method of manufacturing a camera for use in a predetermined environment, comprising the steps of:
    providing a plurality of substantially opaque mask patterns on substantially transparent material, wherein each of the plurality of substantially opaque mask patterns has a first number of openings, including a first and second adjacent openings, and the substantially transparent material has an index of refraction that is greater than an index of refraction of the predetermined environment;
    separating the substantially transparent material into a plurality of structures, wherein each of the plurality of structures contains at least one of the plurality of substantially opaque mask patterns;
    positioning a first structure of the plurality of structures onto an image sensor comprising a plurality of pixel elements such that light from the predetermined environment is capable of passing through the first number of openings onto the image sensor and illuminating a second number of pixel elements of the plurality of pixel elements of the image sensor; and
    configuring the camera to acquire an image from the second number of pixel elements,
    wherein
        the second number of pixel elements is greater than the first number of openings of the first structure, and
        a space between the first and second adjacent openings is selected such that light incident on the image sensor via the first adjacent opening and light incident on the image sensor via the second adjacent opening do not overlap.

2. The method of claim 1, further comprising depositing adhesive onto the image sensor before the step of positioning the first structure onto the image sensor.

3. The method of claim 2, further comprising exposing the first structure and the adhesive to ultraviolet light after the step of mounting the first structure onto the image sensor, wherein the adhesive is curable using ultraviolet light.

4. The method of claim 1, wherein the step of providing the plurality of substantially opaque mask patterns comprises a printing process.

5. The method of claim 4, wherein the printing process is a photoplotting process.

6. The method of claim 1 wherein the step of providing the plurality of substantially opaque mask patterns comprises depositing substantially opaque material onto the substantially transparent material.

7. The method of claim 1, wherein the substantially transparent material is a sheet of plastic.

8. The method of claim 1, further comprising mounting a second piece of substantially transparent material onto the first structure.

9. The method of claim 8, wherein the second piece of substantially transparent material is a lens.

10. The method of claim 1, further comprising providing each opening of the first number of openings with a first shape corresponding to a second shape of a light sensitive portion of the image sensor.

11. The method of claim 1, further comprising providing each opening of the first number of openings with an elongated shape.

12. The method of claim 1, further comprising providing substantially opaque material onto edges of the first structure such that light from the environment may reach the image sensor substantially only through the first number of openings of the substantially opaque mask pattern of the first structure.

13. The method of claim 1, further comprising forming the first number of openings of each substantially opaque mask patterns to be substantially transparent.

14. The method of claim 1, wherein the step of providing the plurality of substantially opaque mask patterns on the substantially transparent material further comprises providing the plurality of substantially opaque mask patterns on the substantially transparent material having a first surface that is substantially flat.

15. The method of claim 14, wherein the step of providing the plurality of substantially opaque mask patterns on the substantially transparent material having a first side that is substantially flat further comprises providing the plurality of substantially opaque mask patterns on the substantially transparent material having a second side opposite the first side that is substantially flat.

16. The method of claim 14, wherein the step of providing the plurality of substantially opaque mask patterns on the substantially transparent material having a first side that is substantially flat further comprises providing the plurality of substantially opaque mask patterns on the substantially transparent material having a second side opposite the first side that is substantially curved.

17. A method of manufacturing at least one camera for use in a predetermined environment, comprising the steps of:
  providing a plurality of image sensor circuits on a semiconductor substrate, wherein each image sensor circuit of the plurality of image sensor circuits comprises a plurality of pixel elements;
  providing a layer of substantially transparent material on the plurality of image sensor circuits, wherein the layer of substantially transparent material has an index of refraction that is greater than an index of refraction of the predetermined environment;
  positioning a plurality of substantially opaque mask patterns on the layer of substantially transparent material, wherein each image sensor circuit of the plurality of image sensor circuits is associated with at least one substantially opaque mask pattern of the plurality of substantially opaque mask patterns, and the positioning is such that light from the predetermined environment is capable of passing through a first number of openings of the at least one substantially opaque mask pattern and illuminating a second number of pixel elements of the plurality of pixel elements of the image sensor circuit, wherein the second number of pixel elements is greater than the first number of openings, wherein each of the at least one substantially opaque mask pattern includes first and second adjacent openings;
  selecting a space between the first and second adjacent openings such that light incident on an image sensor via the first adjacent opening and light incident on the image sensor via the second adjacent opening do not overlap; and
  separating the semiconductor substrate into a plurality of pieces.

18. The method of claim 17, wherein the step of providing the layer of substantially transparent material onto the plurality of image sensor circuits further comprises a step of applying adhesive between the plurality of image sensor circuits and the layer of substantially transparent material.

19. A method of manufacturing a plurality of cameras for use in a predetermined environment, comprising the steps of:
  providing a plurality of image sensor circuits on a semiconductor substrate, wherein each image sensor circuit of the plurality of image sensor circuits comprises a plurality of pixel circuits;
  positioning a plurality of substantially opaque optical mask patterns on a substantially transparent material, wherein each of the plurality of substantially opaque mask patterns has a first number of openings, including a first and second adjacent openings, and the substantially transparent material has an index of refraction that is greater than an index of refraction of the predetermined environment, and the positioning is such that light from the predetermined environment is capable of passing through the first number of openings of each optical mask pattern and illuminating a second number of pixels of the at least one image sensor circuit;
  selecting a space between the first and second adjacent openings such that light incident on an image sensor via the first adjacent opening and light incident on the image sensor via the second adjacent opening do not overlap;
  attaching the substantially transparent material to the semiconductor substrate; and
  separating the semiconductor substrate and the substantially transparent material into a plurality of pieces, wherein each piece of the plurality of pieces comprises at least one image sensor circuit of the plurality of image sensor circuits and at least one substantially opaque optical mask pattern of the plurality of substantially opaque mask patterns,
  wherein the second number of pixels is greater than the first number of openings.

20. The method of claim 19, wherein the step of attaching the substantially transparent material to the semiconductor substrate further comprises a step of applying adhesive between the substantially transparent material and the semiconductor substrate.

21. The method of claim 1, wherein the camera does not comprise a restricting structure between the first and second openings to prevent overlapping of refracted light from each of the first and second openings.

22. The method of claim 1, wherein the transparent material is continuous from the first to the second adjacent openings.

23. The method of claim 1, wherein light incident on the first opening is refracted in the transparent material based on the index of refraction of the transparent material such that the refracted light incident on the first opening does not intersect with refracted light incident on the second opening.

24. The method of claim 1, wherein the space between the first and second adjacent openings is further selected such that light incident on the image sensor via the first adjacent opening and light incident on the image sensor via the second adjacent opening are substantially optically isolated by the Snell's law effect.

25. The method of claim 17, wherein the camera does not comprise a restricting structure between the first and second openings to prevent overlapping of refracted light from each of the first and second openings.

26. The method of claim 17, wherein the transparent material is continuous from the first to the second adjacent openings.

27. The method of claim 17, wherein light incident on the first opening is refracted in the transparent material based on the index of refraction of the transparent material such that the refracted light incident on the first opening does not intersect with refracted light incident on the second opening.

28. The method of claim 17, wherein the space between the first and second adjacent openings is further selected such that light incident on the image sensor via the first adjacent opening and light incident on the image sensor via the second adjacent opening are substantially optically isolated by the Snell's law effect.

29. The method of claim 19, wherein the camera does not comprise a restricting structure between the first and second openings to prevent overlapping of refracted light from each of the first and second openings.

30. The method of claim 19, wherein the transparent material is continuous from the first to the second adjacent openings.

31. The method of claim 19, wherein light incident on the first opening is refracted in the transparent material based on the index of refraction of the transparent material such that the refracted light incident on the first opening does not intersect with refracted light incident on the second opening.

32. The method of claim 19, wherein the space between the first and second adjacent openings is further selected such that light incident on the image sensor via the first adjacent opening and light incident on the image sensor via the second adjacent opening are substantially optically isolated by the Snell's law effect.

* * * * *